(12) United States Patent
Wu et al.

(10) Patent No.: US 10,134,709 B1
(45) Date of Patent: Nov. 20, 2018

(54) SUBSTRATELESS LIGHT EMITTING DIODE (LED) PACKAGE FOR SIZE SHRINKING AND INCREASED RESOLUTION OF DISPLAY DEVICE

(71) Applicant: Industrial Technology Research Institute, Hsinchu (TW)

(72) Inventors: Ming-Hsien Wu, Tainan (TW); Yao-Jun Tsai, Taoyuan (TW); Chia-Hsin Chao, Hsinchu County (TW); Yen-Hsiang Fang, New Taipei (TW); Yi-Chen Lin, Taipei (TW); Ching-Ya Yeh, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/849,692

(22) Filed: Dec. 21, 2017

(51) Int. Cl.
*H01L 25/16* (2006.01)
*H01L 25/065* (2006.01)
*H01L 33/62* (2010.01)
*H01L 33/58* (2010.01)
*H01L 33/50* (2010.01)
(Continued)

(52) U.S. Cl.
CPC ........ *H01L 25/0655* (2013.01); *H01L 25/167* (2013.01); *H01L 33/0079* (2013.01); *H01L 33/502* (2013.01); *H01L 33/54* (2013.01); *H01L 33/58* (2013.01); *H01L 33/62* (2013.01); *H01L 2933/005* (2013.01);
(Continued)

(58) Field of Classification Search
CPC ............... H01L 25/0655; H01L 25/167; H01L 33/0079; H01L 33/502; H01L 33/52; H01L 33/54; H01L 33/58; H01L 33/62
See application file for complete search history.

(56) References Cited

U.S. PATENT DOCUMENTS 6,871,982 B2   3/2005 Holman et al.
8,736,527 B2   5/2014 Verlinden
(Continued)

FOREIGN PATENT DOCUMENTS

CN   102214650   10/2011
TW   I588984    6/2017

OTHER PUBLICATIONS

Christian Goßler et al., Abstract of "GaN-based micro-LED arrays on flexible substrates for optical cochlear Implants", Journal of Physics D: Applied Physics, Apr. 2014, pp. 1-4.
(Continued)

*Primary Examiner* — Andrew Q Tran
(74) *Attorney, Agent, or Firm* — JCIPRNET

(57) ABSTRACT

A light emitting diode package including a circuit layer, a light-shielding layer, a plurality of light emitting diodes and an encapsulation layer is provided. A thickness of the circuit layer is less than 100 μm. The light-shielding layer is disposed on a first surface of the circuit layer and the light-shielding layer has a plurality of apertures. The light emitting diodes are disposed on the first surface of the circuit layer and in the apertures of the light-shielding layer. The light emitting diodes are electrically connected to the circuit layer. The encapsulation layer covers the light-shielding layer. A refractive index of the encapsulation layer is 1.4 and to 1.7. The Young's modulus of the encapsulation layer is larger than or equal to 1 GPa. A thickness of the encapsulation layer is greater than thicknesses of the light emitting diodes.

10 Claims, 26 Drawing Sheets

(51) Int. Cl.
   *H01L 33/00*     (2010.01)
   *H01L 33/54*     (2010.01)
(52) U.S. Cl.
   CPC .............. *H01L 2933/0041* (2013.01); *H01L 2933/0058* (2013.01); *H01L 2933/0066* (2013.01)

(56) References Cited

U.S. PATENT DOCUMENTS

| | | |
|---|---|---|
| 8,780,023 B2 | 7/2014 | Ootorii |
| 9,448,356 B2 | 9/2016 | Cho et al. |
| 9,711,489 B2 | 7/2017 | Pang et al. |
| 9,929,326 B2 * | 3/2018 | Yan .................. H01L 33/58 |
| 2005/0127390 A1 | 6/2005 | Lin et al. |
| 2011/0037083 A1 | 2/2011 | Chan et al. |
| 2011/0198628 A1 | 8/2011 | Kim |
| 2012/0248422 A1 * | 10/2012 | Mine .................. H01L 51/5256 |
| | | 257/40 |
| 2017/0064291 A1 | 3/2017 | Do et al. |

OTHER PUBLICATIONS

Jacob Day et al., "III-Nitride full-scale high-resolution microdisplays", Applied Physics Letters, Jul. 2011, pp. 1-4.

François Templier., "GaN-based emissive microdisplays: A very promising technology for compact, ultra-high brightness display systems", Journal of the SID, Nov. 2016, pp. 669-675.

François Olivier et al., "Influence of size-reduction on the performances of GaN-based micro-LEDs for display application", Journal of Luminescence, Nov. 2017, pp. 112-116.

Johannes Herrnsdorf et al., "Active-Matrix GaN Micro Light-Emitting Diode Display With Unprecedented Brightness", IEEE Transactions on Electron Devices, Jun. 2015, pp. 1918-1925.

\* cited by examiner

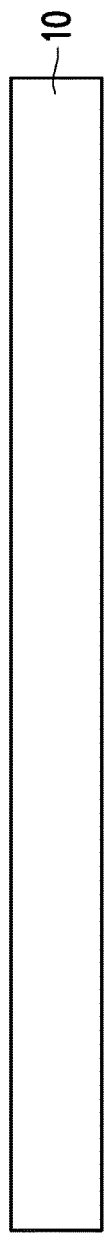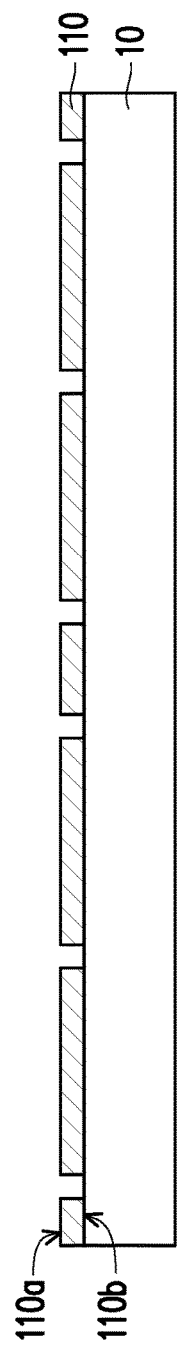
FIG. 1A
FIG. 1B

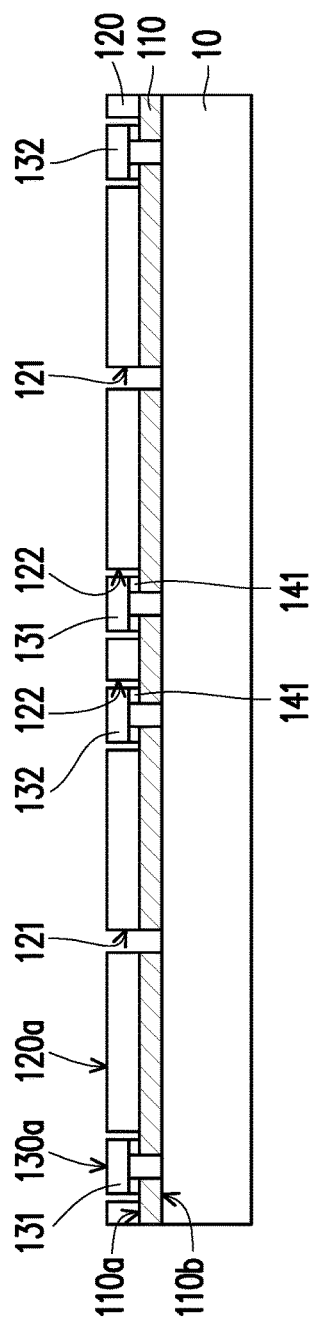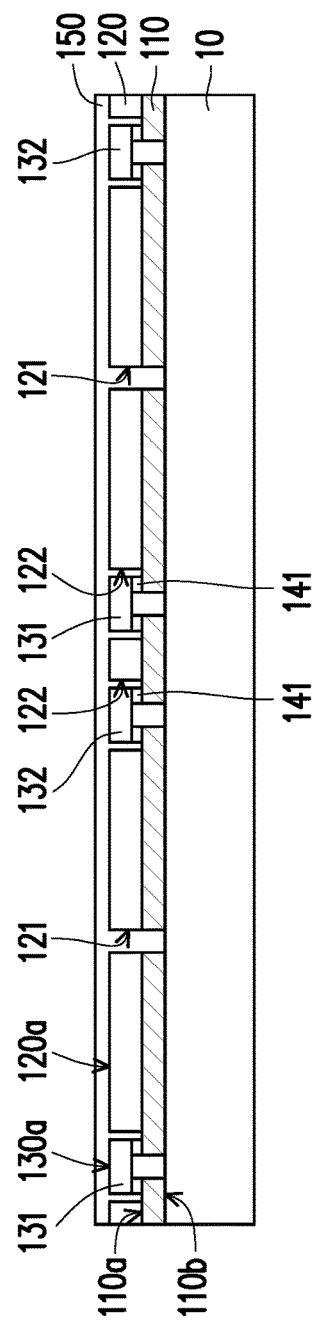

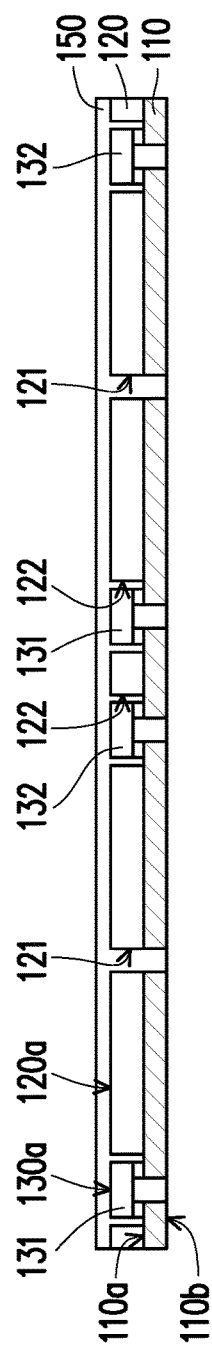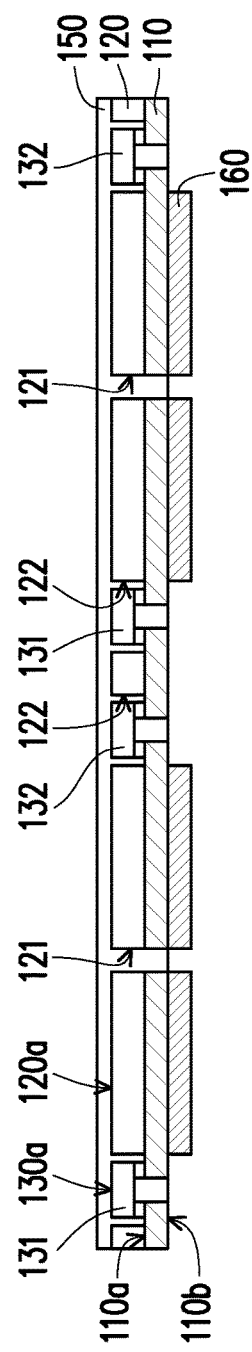

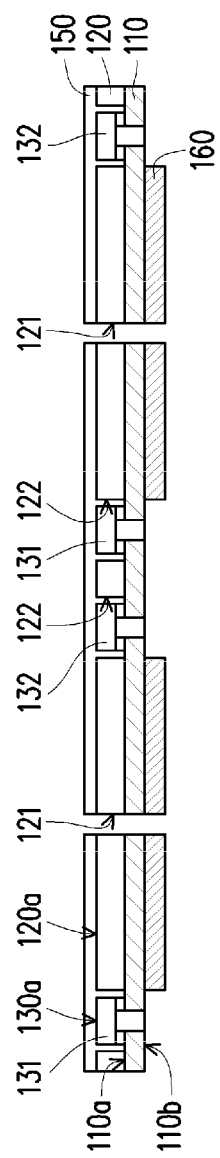
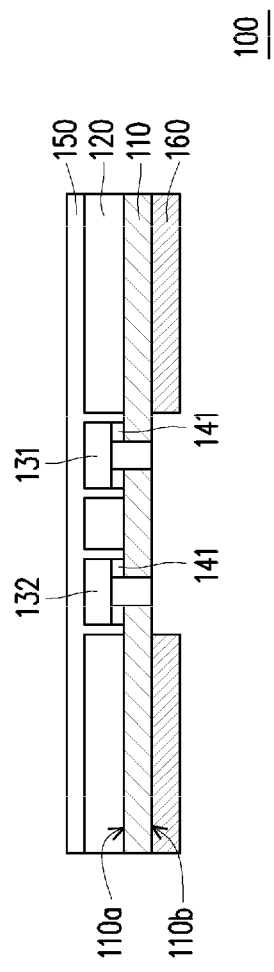
FIG. 1I
FIG. 1J

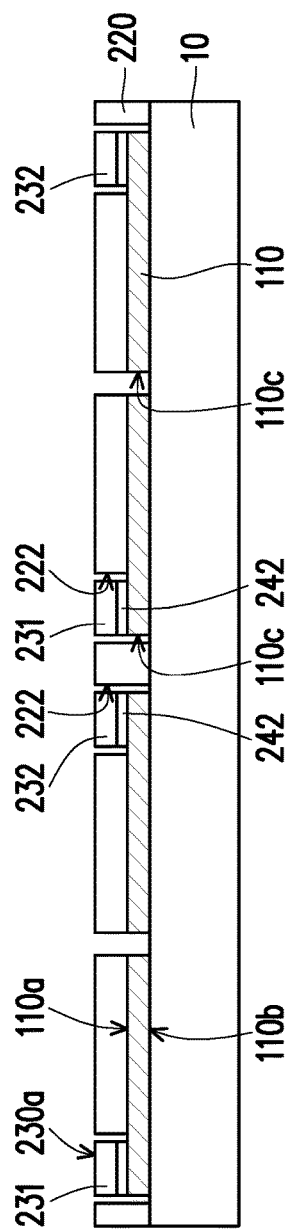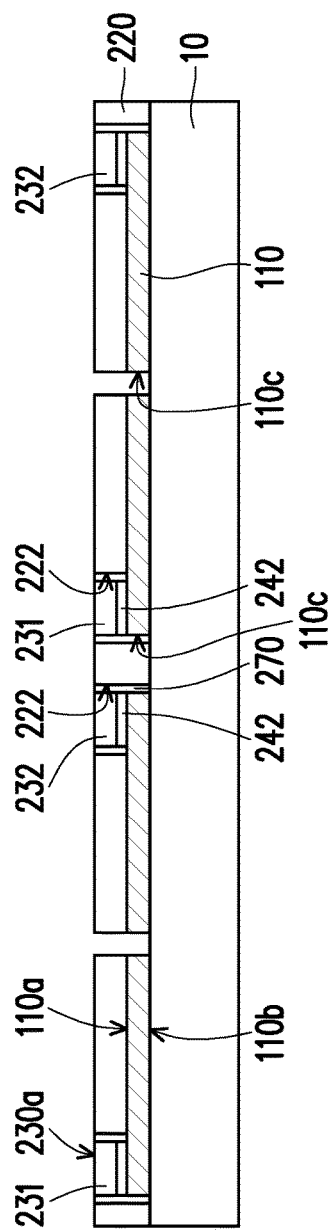

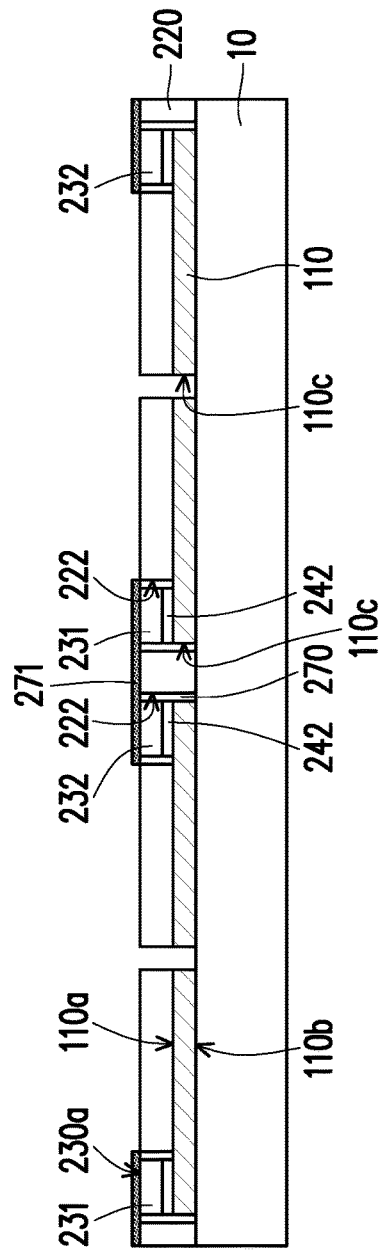
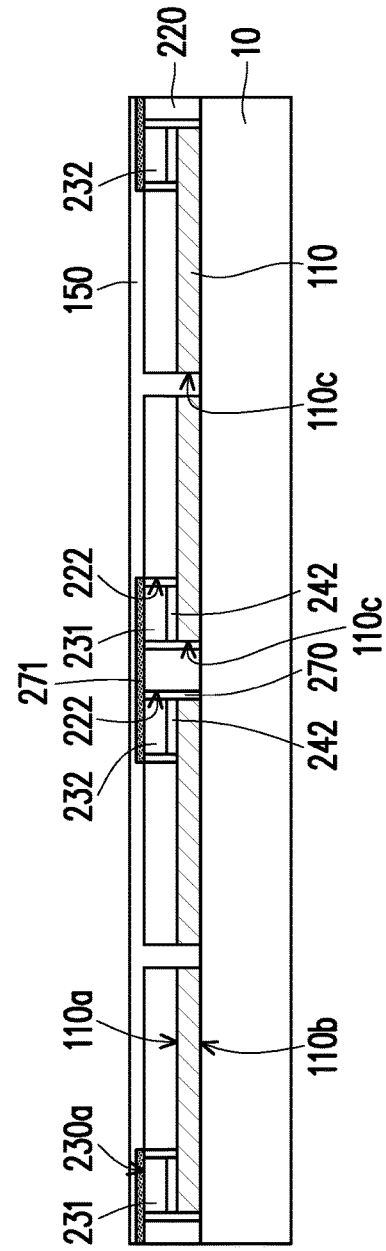
FIG. 2E
FIG. 2F

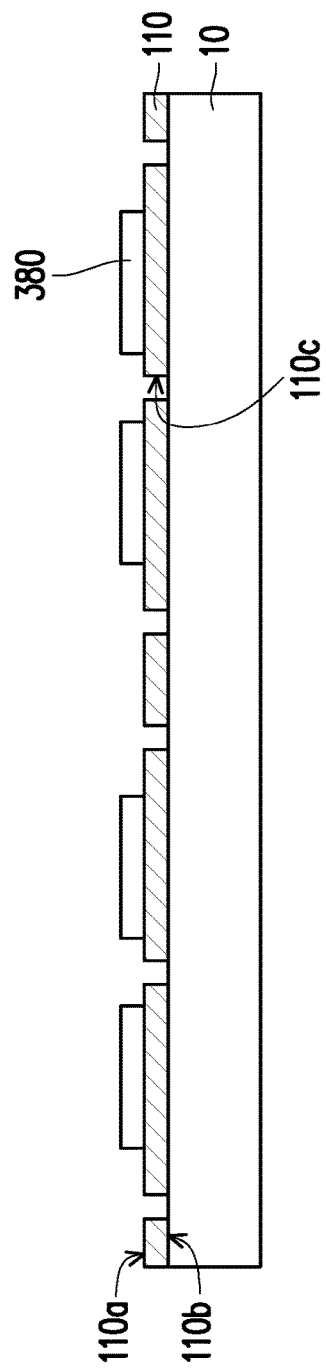
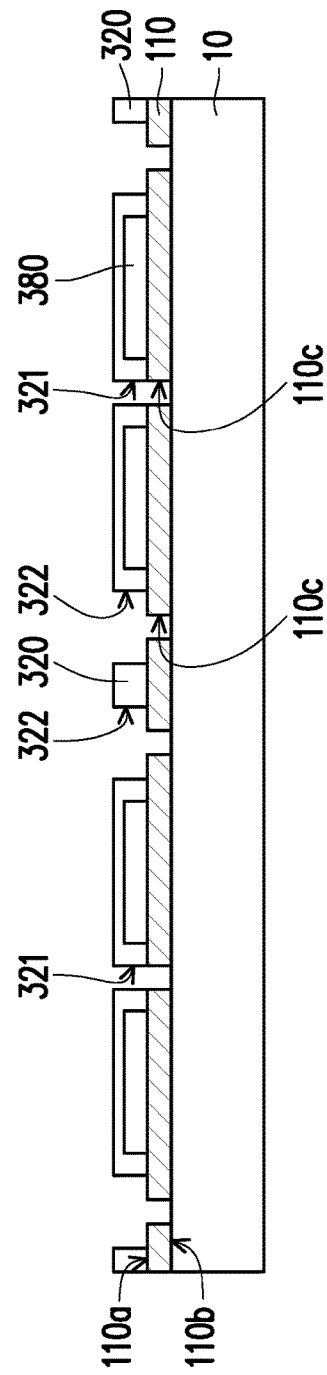
FIG. 3A
FIG. 3B

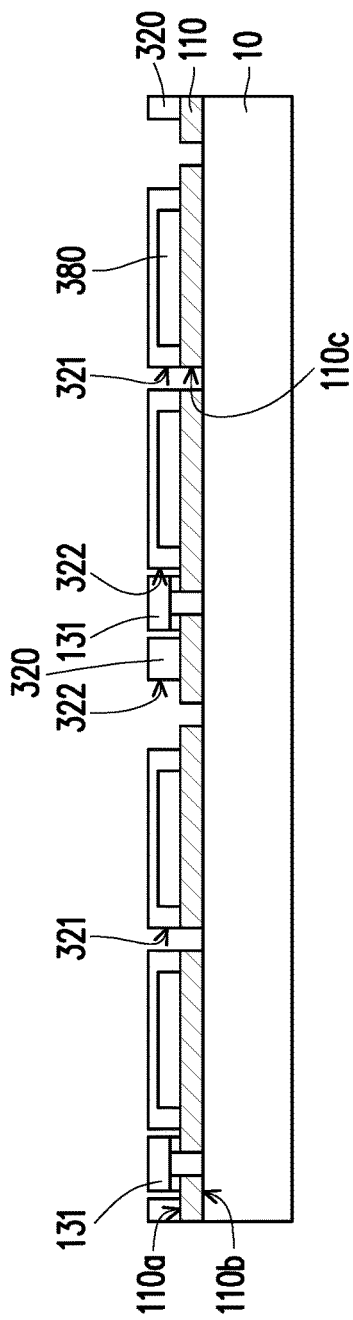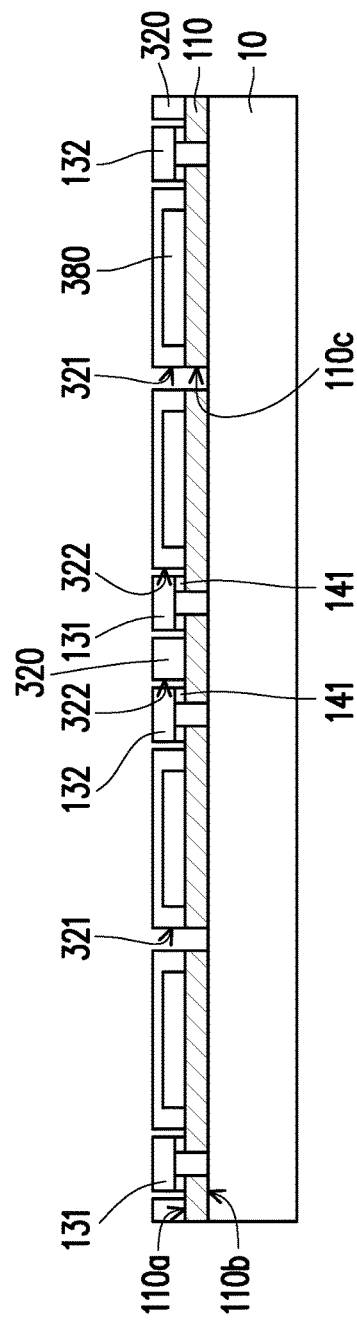

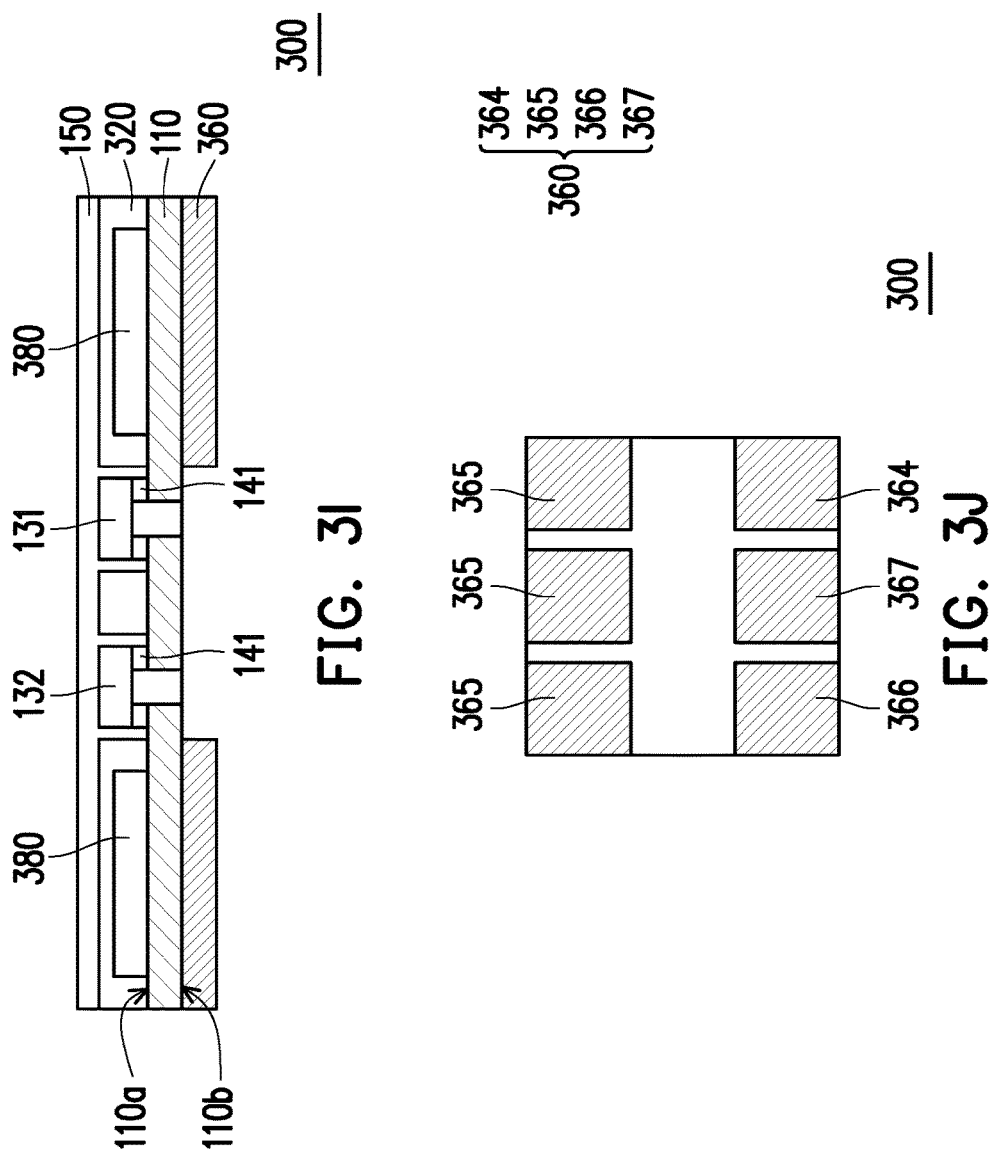

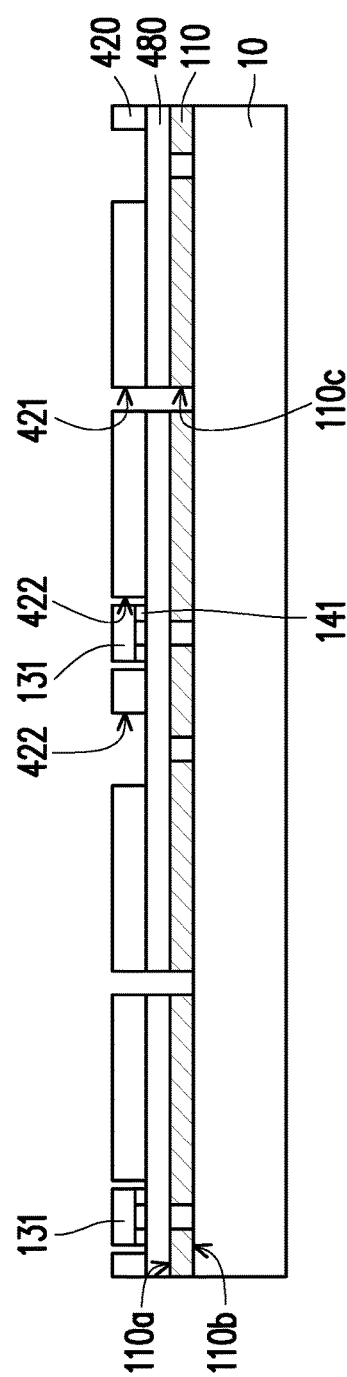
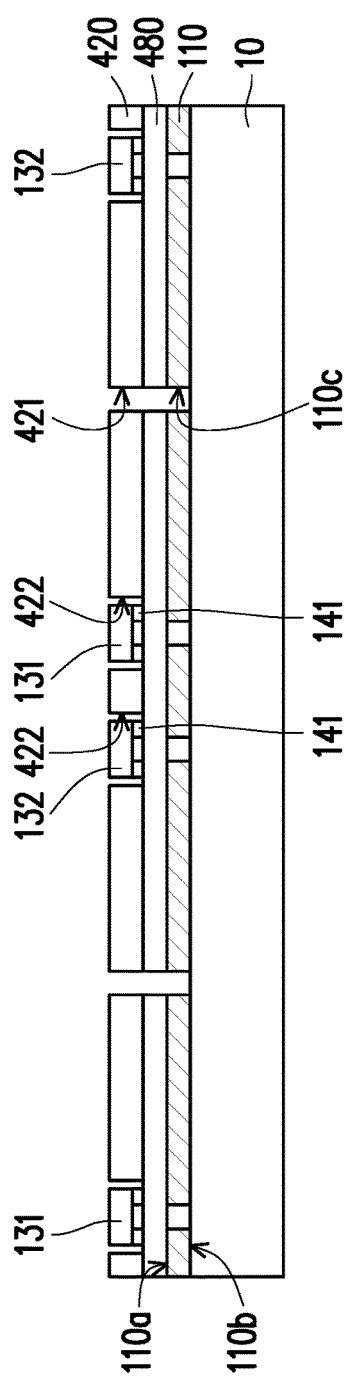
FIG. 4C
FIG. 4D

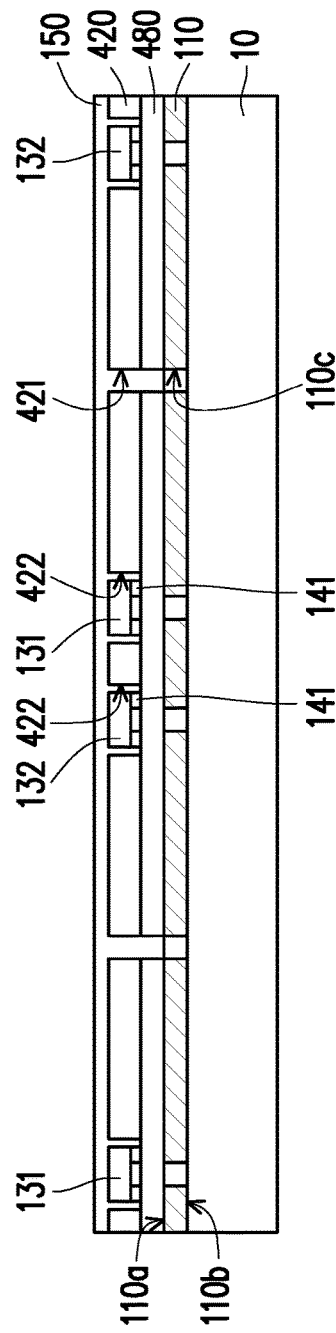
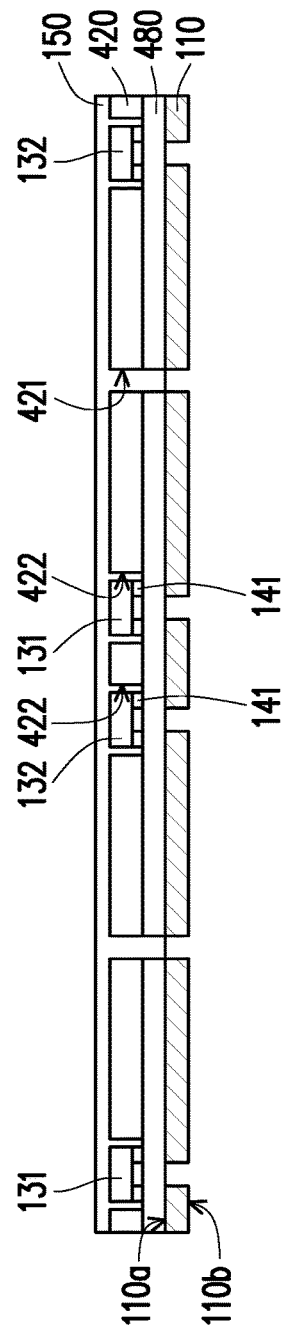
FIG. 4E
FIG. 4F

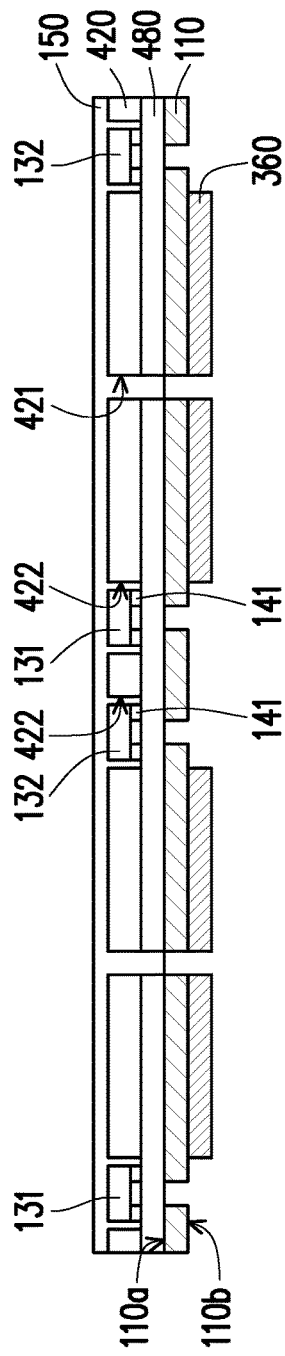
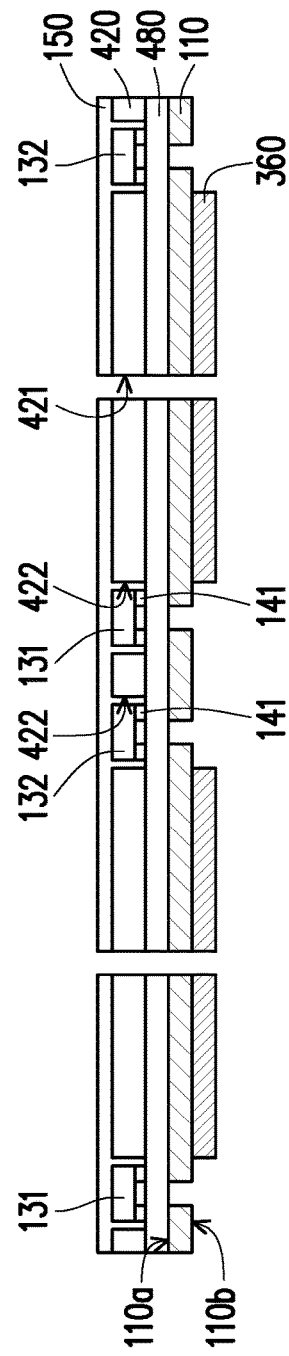
FIG. 4G
FIG. 4H

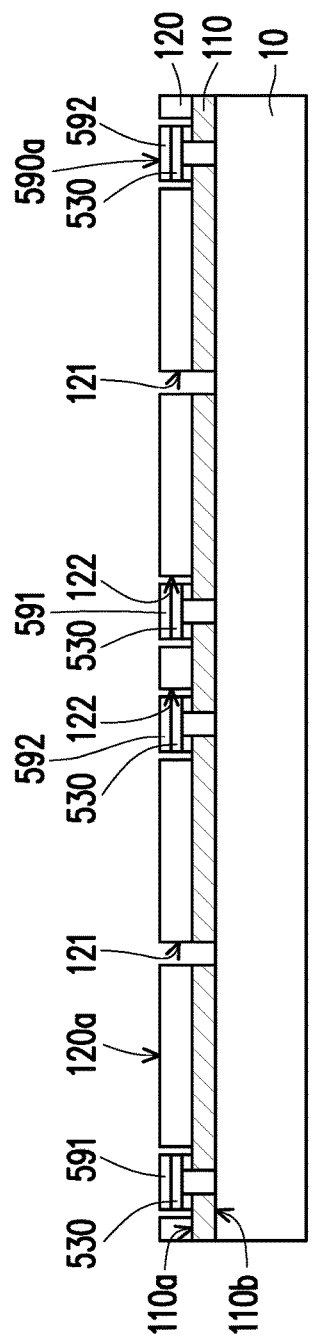
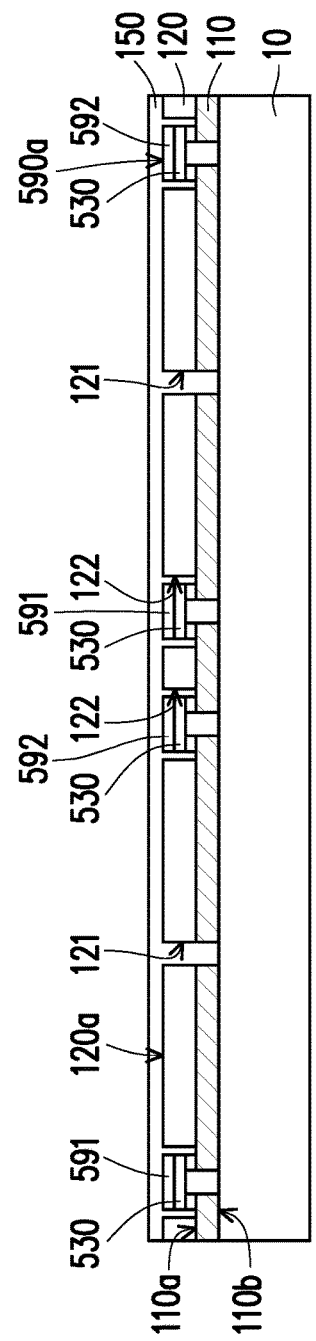
FIG. 5C
FIG. 5D

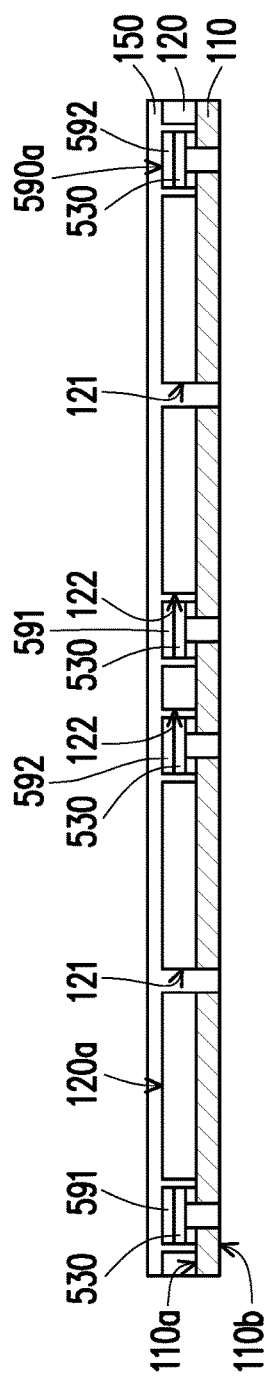
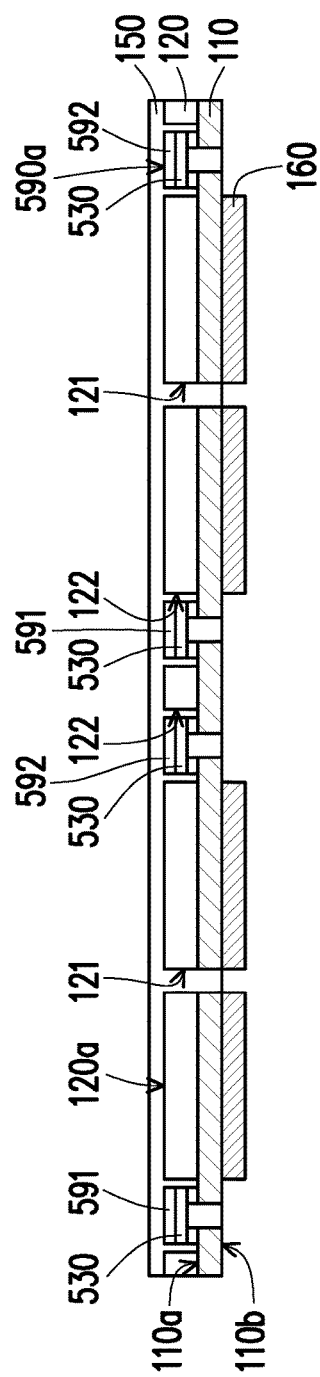
FIG. 5E
FIG. 5F

SUBSTRATELESS LIGHT EMITTING DIODE (LED) PACKAGE FOR SIZE SHRINKING AND INCREASED RESOLUTION OF DISPLAY DEVICE

BACKGROUND

Technical Field

The disclosure relates to a light emitting diode package and a method of manufacturing the light emitting diode package.

Description of Related Art

A light emitting diode (LED) has advantages such as long service life, small volume, high shock resistance, low heat production and low power consumption and is therefore widely used in an indicator or a light source of domestic and various appliances. In recent years, the light emitting diode has been designed to display many colors and high brightness. Therefore, the light emitting diode has been further applied to a large outdoor billboard, traffic light and relevant fields. In the future, the light emitting diode may even become a main light source for illumination that is energy-efficient and environmentally-friendly.

In an ordinary display device having the light emitting diode, the light emitting diode is usually disposed on a circuit substrate by adopting the techniques of surface mount devices (SMD) or chip on board (COB). However, in the case of the technique of surface mount devices, limits imposed by a size of package are likely to make it hard to achieve the finer pitch. Moreover, the installation of the light emitting diode may lead to a chromatic aberration from different viewing angle, thereby affecting the display quality. In addition, in the case of the technique of chip on board, since a light emitting diode chip is encapsulated on the circuit substrate having driving circuitry, the light emitting diode is difficult to inspect and repair. For this reason, higher package costs are caused. Therefore, how to increase the yield and reliability of a product through advances in the structure and manufacture method of the light emitting diode package to reduce manufacturing costs and create more desirable display quality has become a current issue to resolve.

SUMMARY

The disclosure provides a light emitting diode package and a method of manufacturing the light emitting diode package.

An exemplary embodiment of the disclosure provides a light emitting diode package including a circuit layer, a light-shielding layer, a plurality of light emitting diodes and an encapsulation layer. A thickness of the circuit layer is smaller than 100 micrometers. The light-shielding layer is disposed on the circuit layer and includes a plurality of apertures. The light emitting diodes are disposed on the circuit layer and in the apertures of the light-shielding layer. The light emitting diodes are electrically connected to the circuit layer. The encapsulation layer covers the light-shielding layer. A refractive index of the encapsulation layer is 1.4 to 1.7. A Young's modulus of the encapsulation layer is greater than or equal to 1 gigapascal (GPa). A thickness of the encapsulation layer is greater than a thickness of the light emitting diode.

An exemplary embodiment of the disclosure provides a method of manufacturing a light emitting diode package. The method includes the following steps. A circuit layer is formed on a temporary carrier and includes a first surface and a second surface that is opposite to the first surface and faces the temporary carrier. A light-shielding layer is formed on the first surface of the circuit layer. The light-shielding layer includes a first aperture exposing a part of the temporary carrier and a plurality of second apertures. A plurality of light emitting diodes are disposed on the circuit layer. The light emitting diodes are disposed in the apertures and electrically connected to the circuit layer. The encapsulation layer is formed on the temporary carrier to cover the light-shielding layer and the plurality of light emitting diodes. The temporary carrier is removed to expose the second surface of the circuit layer. A plurality of connecting pads are formed on the second surface of the circuit layer. The plurality of light emitting diode packages are formed by performing a singulation process.

Several exemplary embodiments accompanied with figures are described in detail below to further describe the disclosure in details.

BRIEF DESCRIPTION OF THE DRAWINGS

The accompanying drawings are included to provide further understanding, and are incorporated in and constitute a part of this specification. The drawings illustrate exemplary embodiments and, together with the description, serve to explain the principles of the disclosure.

FIGS. 1A to 1J are cross-sectional views illustrating a method of manufacturing a light emitting diode package according to a first embodiment of the disclosure.

FIGS. 2A to 2J are cross-sectional views illustrating a part of a method of manufacturing a light emitting diode package according to a second embodiment of the disclosure.

FIGS. 3A to 3I are cross-sectional views illustrating a part of a method of manufacturing a light emitting diode package according to a third embodiment of the disclosure.

FIG. 3J is a bottom view illustrating the light emitting diode package according to the third embodiment of the disclosure.

FIGS. 4A to 4I are cross-sectional views illustrating a part of a method of manufacturing a light emitting diode package according to a fourth embodiment of the disclosure.

FIGS. 5A to 5H are cross-sectional views illustrating a part of a method of manufacturing a light emitting diode package according to a fifth embodiment of the disclosure.

DESCRIPTION OF THE EMBODIMENTS

FIGS. 1A to 1J are cross-sectional views illustrating a method of manufacturing a light emitting diode package according to a first embodiment of the disclosure. FIG. 1K is a top view illustrating the light emitting diode package according to the first embodiment of the disclosure. FIG. 1L is a bottom view illustrating the light emitting diode package according to the first embodiment of the disclosure. FIG. 1M is a circuit diagram illustrating the light emitting diode package according to the first embodiment of the disclosure.

First, referring to FIG. 1A, a temporary carrier 10 is provided. A material of the temporary carrier 10 may be glass, quartz, wafer, organic polymer, metal, or the like. Other suitable materials may also be used in the temporary carrier 10. The materials described above are acceptable on the condition that those materials can support a film layer or a device formed thereon and endure the following manufacturing processes. The disclosure is not limited thereto.

Next, referring to FIG. 1B, a circuit layer 110 is formed on the temporary carrier 10 and includes a first surface 110a and a second surface 110b that is opposite to the first surface 110a and contacts the temporary carrier 10. Specifically, a method of manufacturing the circuit layer 110 may include, for example, the following steps. First, a conductive material is formed on the temporary carrier 10 through a deposition process or other suitable processes. Subsequently, the conductive material on the temporary carrier 10 is patterned through patterning processes such as lithography and etching process, and the like, to form the circuit layer 110. In general, a thickness of the circuit layer 110 may be less than 100 micrometers through the formation method described above. However, the disclosure is not limited to the formation method and thickness of the circuit layer 110. In addition, considering conductivity, the circuit layer 110 is usually made of metal, but the disclosure is not limited thereto. According to other exemplary embodiments of the disclosure, the circuit layer 110 may also be made of other conductive materials, such as alloy, metal oxide, metal nitride, metal nitrogen oxide, graphene, carbon nanotube, other appropriate conductive materials or a stacking layer of at least two of the materials described above.

In some exemplary embodiments of the disclosure, before the circuit layer 110 is formed on the temporary carrier 10, a debonding layer (not shown) may be formed on the temporary carrier 10. The debonding layer is, for example, a a light to heat conversion (LTHC) release layer or other appropriate materials that may facilitate the releasability between the temporary carrier 10 and the circuit layer 110 in the following processes.

Figure 1C:
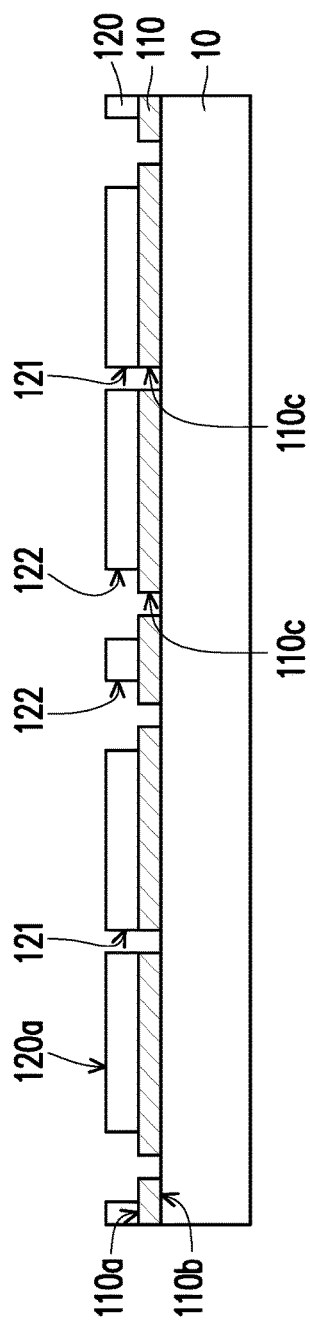

Next, referring to FIG. 1C, after formation of the circuit layer 110, a light-shielding layer 120 is formed on the circuit layer 110. In general, a material of the light-shielding layer 120 may be resin, dielectric material, metal, or the like, and a method of forming the light-shielding layer 120 may include photolithography process, etching process, evaporation process, or coating process to form a plurality of first apertures 121 and second apertures 122. The first aperture 121 and the second aperture 122 penetrate the circuit layer 110 to expose at least the temporary carrier 10. Moreover, the second aperture 122 further exposes a part of the first surface 110a and sidewalls 110c of the circuit layer 110. According to the exemplary embodiment of the disclosure, the first aperture 121 may be, for example, a trench. The trench-shaped first aperture 121 may surround the plurality of second apertures 122, and in the following processes, the trench-shaped first aperture 121 may basically define a size of a light emitting diode package 100.

According to the exemplary embodiment of the disclosure, the first aperture 121 exposes the sidewalls 110c of the circuit layer 110, but the disclosure is not limited thereto. According to other embodiments of the disclosure, the light-shielding layer 120 may also cover the sidewalls 110c of the circuit layer 110 exposed the first aperture 121.

Figure 1D:
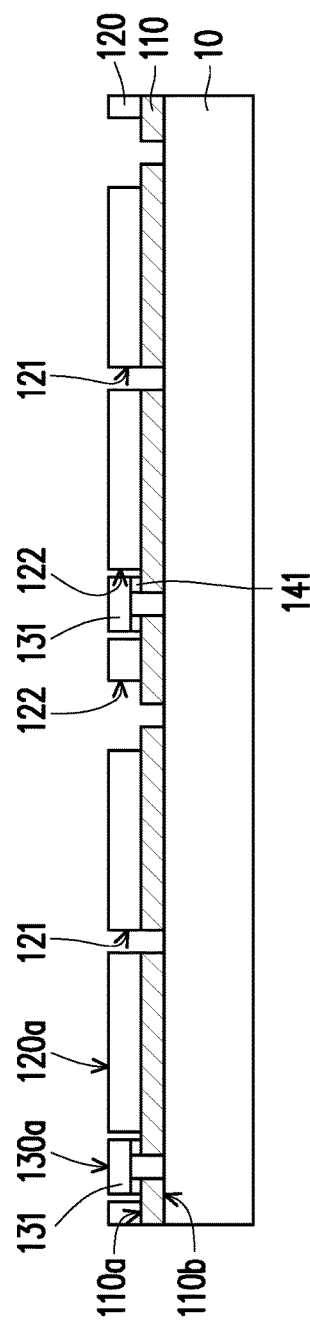
Figure 1M:
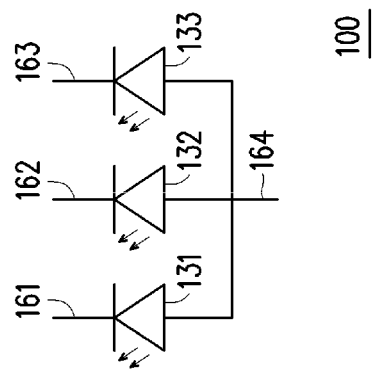
FIG. 1M is a circuit diagram illustrating the light emitting diode package according to the first embodiment of the disclosure.
Figure 1L:
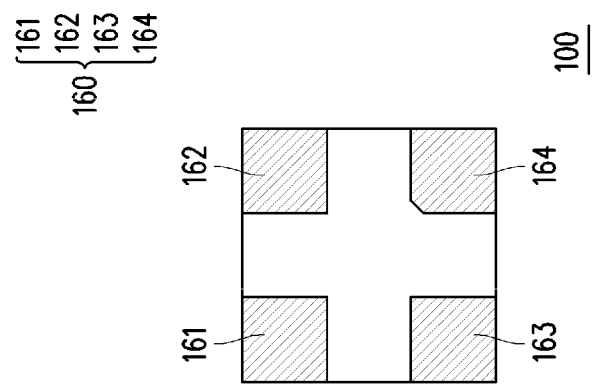
FIG. 1L is a bottom view illustrating the light emitting diode package according to the first embodiment of the disclosure.
Figure 1K:
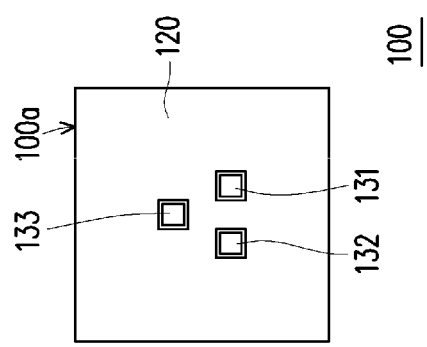
FIG. 1K is a top view illustrating the light emitting diode package according to the first embodiment of the disclosure.

Next, referring to FIG. 1D, a plurality of first light emitting diodes 131 are disposed on the circuit layer 110, and the first light emitting diodes 131 are located in the corresponding second aperture 122. The installation of the first light emitting diodes 131 may be accomplished through a mass transfer process, but the disclosure is not limited thereto.

Next, referring to FIG. 1E, a plurality of second light emitting diodes 132 and third light emitting diodes 133 (shown in FIG. 1K) may be disposed sequentially on the circuit layer 110 in a similar way to the way that the first light emitting diode 131 is disposed. The first light emitting diode 131, the second light emitting diode 132 and the third light emitting diode 133 are disposed in the different second apertures 122 respectively.

According to the exemplary embodiment of the disclosure, the light emitting diodes 131, 132 and 133 may be horizontal type light emitting diodes and may be electrically connected to the corresponding circuit layer 110 through a connecting terminal 141, wherein the connecting terminal 141 may be a solder ball used in flip chip bonding. However, the disclosure is not limited thereto.

According to the exemplary embodiment of the disclosure, a light-exiting top surface 130a of the light emitting diodes 131, 132 and 133 (shown in FIG. 1M) may be aligned with a light blocking top surface 120a of the light-shielding layer 120, but the disclosure is not limited thereto. According to other exemplary embodiments of the disclosure, the light-exiting top surface 130a of the light emitting diodes 131, 132 and 133 may be lower than the light-blocking top surface 120a of the light-shielding layer 120. In other words, a distance between the light-exiting top surface 130a and the first surface 110a may be smaller than a distance between the light blocking top surface 120a and the first surface 110a.

Next, referring to FIGS. 1E and 1F, after the light emitting diodes 131, 132 and 133 (shown in FIG. 1M) are disposed on the circuit layer 110 and electrically connected to the circuit layer 110, an encapsulation layer 150 having a light-transmitting property is formed on the temporary carrier 10 to cover the light-shielding layer 120 and the light emitting diodes 131, 132 and 133. Moreover, the encapsulation layer 150 may be further filled in the first aperture 121 and the second aperture 122 of the light-shielding layer 120 to cover the temporary carrier 10 exposed by the first aperture 121 and the second aperture 122. According to the exemplary embodiment of the disclosure, the method of forming the encapsulation layer 150 is, for example, by forming a transparent encapsulation material on the light-shielding layer 120 and the light emitting diodes 131, 132 and 133 through a coating method, a sol-gel method or a lamination method and filling the transparent encapsulation material in the first aperture 121 and the second aperture 122. Subsequently, a photopolymerization process or a baking process is performed according to the property of the transparent encapsulation material, so the transparent encapsulation material is cured to form the encapsulation layer 150 having a light-transmitting property. A material of the encapsulation layer 150 may be a hydrocarbon polymer material with a chain structure, such as a rubber-series plastic material, an acrylic-series plastic material or a silicone-resin-series plastic material, but the disclosure is not limited thereto. A Young's modulus of the encapsulation layer 150 may be greater than or substantially equal to 1 GPa to reduce the risk of damaging the light emitting diodes 131, 132 and 133 and the circuit layer 110 encapsulated by the encapsulation layer 150. In general, a refractive index of the encapsulation layer 150 is about 1.4 to about 1.7, but the disclosure is not limited thereto.

Next, referring to FIGS. 1F to 1G, after formation of the encapsulation layer 150, the temporary carrier 10 may be removed through a debonding process to expose the second surface 110b of the circuit layer 110. In other words, the light emitting diode package 100 (shown in FIG. 1J) according to the exemplary embodiment of the disclosure may be a substrateless package without a substrate included therein.

According to the exemplary embodiment of the disclosure, the temporary carrier 10 may be removed from the second surface 110b of the circuit layer 110 by using mechanical release process, but the disclosure is not limited thereto. Take an embodiment that the debonding layer is provided between the temporary carrier 10 and the circuit layer 110, for example. Thermal or light energy (produced by heating or ultraviolet light irradiation, for example) may be applied to the debonding layer. In this way, the adhesion of the debonding layer is reduced to make the temporary carrier 10 easily detached from the second surface 110b of the circuit layer 110.

Next, referring to FIG. 1H, a plurality of connecting pads 160 are formed on the second surface 110b of the circuit layer 110. Each of the connecting pads 160 may be electrically connected to the corresponding light emitting diodes 131, 132 and 133 through the circuit layer 110. Specifically, a method of manufacturing the connecting pads 160 may include, for example the following steps. First, a conductive material is formed on the second surface 110b of the circuit layer 110 through a deposition process or other appropriate processes. Subsequently, the conductive material on the second surface 110b is patterned through patterning processes such as lithography and etching processes to form the connecting pads 160. However, the disclosure is not limited to the method of forming the connecting pads 160. In addition, considering conductivity, the connecting pads 160 are generally made of metal, but the disclosure is not limited thereto. According to other exemplary embodiments of the disclosure, the connecting pads 160 may be also made of other conductive materials, such as alloy, metal oxide, metal nitride, metal nitrogen oxide, graphene, carbon nanotube, other appropriate conductive materials or a stacking layer of at least two of the materials described above. In addition, in some exemplary embodiments of the disclosure, a plating layer including a metal layer plated with nickel, palladium, gold and the like or an alloy layer may be provided on the connecting pads 160 to enhance the engagement force between the connecting pads 160 and other film layers or devices.

Next, referring to FIGS. 1I and 1J, in FIG. 1I, the plurality of light emitting diode packages 100 as shown in FIG. 1J may be formed through a singulation process. For example, the encapsulation layer 150 provided in the first aperture 121 may be removed through the techniques of water jet cutter, laser cutting or mechanical cutting to form the plurality of light emitting diode packages 100. Above all, after the singulation process is conducted, similar reference numerals are used to denote singulated elements. For example, the singulated circuit layer 110 is called the circuit layer 110, the singulated light emitting diodes 131, 132 and 133 are called the light emitting diodes 131, 132 and 133, the singulated encapsulation layer 150 is called the encapsulation layer 150, and the singulated connecting pads 160 are called the connecting pads 160 and so on. Other singulated elements follow the same rule on the reference numeral, so a detailed description is omitted.

Referring to FIGS. 1J to 1M, after the above process, the production of the light emitting diode package 100 according to the exemplary embodiment of the disclosure may be roughly completed. Above all, to achieve concise illustration, FIG. 1K merely shows the light emitting diodes 131, 132 and 133, as well as the light-shielding layer 120. Moreover, FIG. 1I merely shows the position relation between the connecting pads 160, but the position relation between the connecting pads 160 may be adjusted based on demand for the circuit layout. The disclosure is not limited thereto.

The light emitting diode package 100 described above may include the circuit layer 110, the light-shielding layer 120, the plurality of light emitting diodes 131, 132 and 133, the encapsulation layer 150 and the plurality of connecting pads 160. The circuit layer 110 includes the first surface 110a and the second surface 110b opposite to the first surface 110a. The thickness of the circuit layer 110 is smaller than 100 micrometers. The light shielding layer 120 is located on the first surface 110a of the circuit layer 110 and includes a plurality of apertures. The light emitting diodes 131, 132 and 133 are disposed on the first surface 110a of the circuit layer 110 and in the apertures of the light-shielding layer 120. The light emitting diodes 131, 132 and 133 are electrically connected to the circuit layer 110. The encapsulation layer 150 covers the light-shielding layer 120 and the light emitting diodes 131, 132 and 133. The refractive index of the encapsulation layer 150 is about 1.4 to about 1.7. The Young's modulus of the encapsulation layer 150 is greater than or substantially equal to 1 GPa. A thickness of the encapsulation layer 150 is greater than thicknesses of the light emitting diodes 131, 132 and 133. The plurality of connecting pads 160 are disposed on the second surface 110b of the circuit layer 110, and the number of the connecting pads 160 is greater than the number of the light emitting diodes 131, 132 and 133.

According to the exemplary embodiment of the disclosure, the encapsulation layer 150 has an insulating property and is further filled in the second apertures 122 (shown in FIG. 1F) where the light emitting diodes 131, 132 and 133 are disposed, so as to further cover the circuit layer 110 exposed by the apertures.

According to the exemplary embodiment of the disclosure, the difference between the number of the connecting pads 160 and the number of the light emitting diodes 131, 132 and 133 is 1. Take the embodiments in FIGS. 1J to 1M as an example, the light emitting diodes include a first light emitting diode 131, a second light emitting diode 132 and a third light emitting diode 133. The plurality of connecting pads 160 include a first connecting pad 161, a second connecting pad 162, a third connecting pad 163 and a common bonding pad 164. The first connecting pad 161 is electrically connect to a cathode of the first light emitting diode 131, the second connecting pad 162 is electrically connected to a cathode of the second light emitting diode 132, and the third connecting pad 163 is electrically connected to a cathode of the third light emitting diode 133. Moreover, the common bonding pad 164 is electrically connected to an anode of the first light emitting diode 131, an anode of the second light emitting diode 132 and an anode of the third light emitting diode 133. In other words, in the exemplary embodiment of the disclosure, the anodes of the plurality of light emitting diodes 131, 132 and 133 are electrically connected, but the disclosure is not limited thereto. In other feasible exemplary embodiments of the disclosure, the cathodes of the plurality of light emitting diodes 131, 132 and 133 are electrically connected, but the disclosure is not limited thereto.

In the exemplary embodiment of the disclosure, the first light emitting diode 131, the second light emitting diode 132 and the third light emitting diode 133 may emit light in different colors respectively and be disposed in a delta configuration. In this way, the shortest distance between each of the light emitting diodes 131, 132 and 133 and an edge 100a of the light emitting diode package 100 is not too large, so the display quality may be elevated.

FIGS. 2A to 2J are cross-sectional views illustrating a part of a method of manufacturing a light emitting diode package according to a second embodiment of the disclosure. FIG. 2K is a top view illustrating the light emitting diode package according to the second embodiment of the disclosure. In the exemplary embodiment of the disclosure, a method of manufacturing a light emitting diode package 200 is similar to a method of manufacturing the light emitting diode package 100. Similar elements of the light emitting diode package 200 are denoted by the same reference numerals and have similar functions, materials or forming methods, so a detailed description is omitted. Specifically, FIGS. 2A to 2J are cross-sectional views illustrating the method of manufacturing the light emitting diode package following the steps shown in FIG. 1B.

Figure 2A:
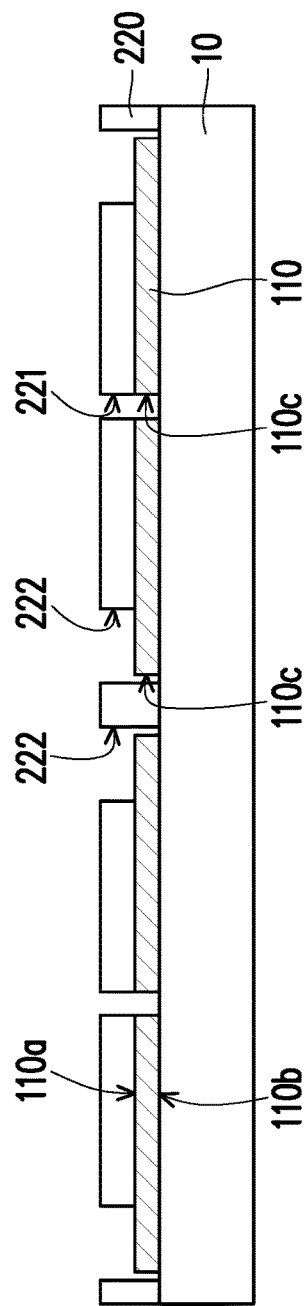

Further to FIG. 1B, referring to FIG. 2A, in the exemplary embodiment of the disclosure, after formation of the circuit layer 110, a light-shielding layer 220 is formed on the temporary carrier 10. The light-shielding layer 220 includes a first aperture 221, a second aperture 222 and a third aperture 224 (shown in FIG. 2K). The first aperture 221 and the second aperture 222 penetrate the circuit layer 110 to expose at least the temporary carrier 10. The third aperture 224 is a through-hole penetrating the light-shielding layer 220 to expose the temporary carrier 10 that is not covered by the circuit layer 110. In addition, the second aperture 222 may further expose a part of the first surface 110a and the sidewalls 110c of the circuit layer 110. In the exemplary embodiment of the disclosure, the first aperture 221 may be, for example, a trench, and the trench-shaped first aperture 221 may surround the plurality of second apertures 222. In the following processes, the trench-shaped first aperture 221 may basically define a size of the light emitting diode package 200.

In the exemplary embodiment of the disclosure, the first aperture 221 exposes the sidewalls 110c of the circuit layer 110, but the disclosure is not limited thereto. In other exemplary embodiments of the disclosure, the light-shielding layer 220 may also cover the sidewalls 110c of the circuit layer 110 exposed by the first aperture 221.

In the exemplary embodiment of the disclosure, a material or a forming method of the light-shielding layer 220 may be similar to the material or the forming method of the light-shielding layer 120 of the exemplary embodiment described above, but the disclosure is not limited thereto.

Figure 2B:
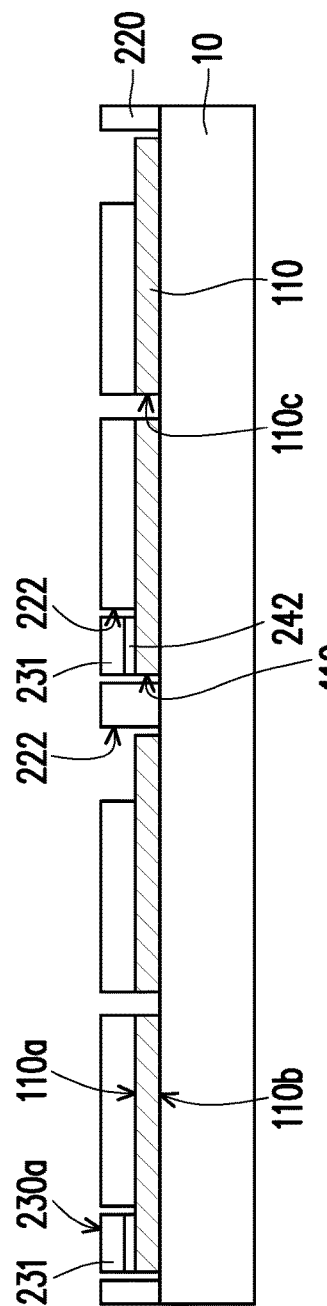

Next, referring to FIG. 2B, a plurality of first light emitting diodes 231 are disposed on the circuit layer 110, and the first light emitting diode 231 is disposed in the corresponding second aperture 222. In the exemplary embodiment of the disclosure, the installation of the first light emitting diode 231 is similar to the installation of the first light emitting diode 131 of the exemplary embodiment described above, so a detailed description is omitted.

Next, referring to FIG. 2C, a plurality of second light emitting diodes 232 and third light emitting diodes 233 (shown in FIG. 2K) are disposed sequentially on the circuit layer 110 in a similar way to the way that the first light emitting diode 231 is disposed. The first light emitting diode 231, the second light emitting diode 232 and the third light emitting diode 233 are disposed in the different second apertures 222 respectively.

In the exemplary embodiment of the disclosure, the light emitting diodes 231, 232 and 233 may be vertical type light emitting diodes and may be electrically connected to the corresponding circuit layer 110. In some exemplary embodiments of the disclosure, a conductive layer 242 may be provided between the light emitting diodes 231, 232 and 233 and the circuit layer 110 and may be, for example, a bonding pad or a conductive film (CF), but the disclosure is not limited thereto.

Next, referring to FIG. 2D, a dielectric layer 270 is formed on the temporary carrier 10. In the exemplary embodiment of the disclosure, a method of forming the dielectric layer 270 is, for example, by filling a dielectric material in the second aperture 222 through a coating method, a sol-gel method or a lamination method. Subsequently, a photopolymerization process or a baking process is performed according to the property of the dielectric material, so the dielectric material is cured to form the dielectric layer 270 to encapsulate at least electric connections between the light emitting diodes 231, 232 and 233 and the circuit layer 110, so the electric connections are prevented from contacting other conductive film layers. A material of the dielectric layer 270 may be a hydrocarbon polymer material having a chain structure, such as a rubber-series plastic material, an acrylic-series plastic material or a silicone-resin-series plastic material, but the disclosure is not limited thereto.

Next, referring to FIG. 2E, a transparent electrode layer 271 is formed. The transparent electrode layer 271 covers a light-exiting top surface 230a of the light emitting diodes 231, 232 and 233 and the light-shielding layer 220 that is disposed between the light emitting diodes 231, 232 and 233, and is further filled in the third aperture 224 of the light-shielding layer 220. In other words, the light emitting diodes 231, 232 and 233 may be electrically connected to each other through the transparent electrode layer 271. A material of the transparent electrode layer 271 includes metal oxides, such as zinc oxide (ZnO), Tin oxide (SnO), indium-zinc oxide (IZO), gallium-zinc oxide (GZO), zinc-tin oxide (ZTO), indium-tin oxide (ITO), other appropriate oxides or a stacking layer of at least two of the oxides described above, but the disclosure is not limited thereto.

Next, referring to FIG. 2F, the encapsulation layer 150 having a light-transmitting property is formed on the temporary carrier 10 and filled in the first aperture 221 to cover the light-shielding layer 220 that is disposed on the circuit layer 110 and the transparent electrode layer 271.

Figure 2G:
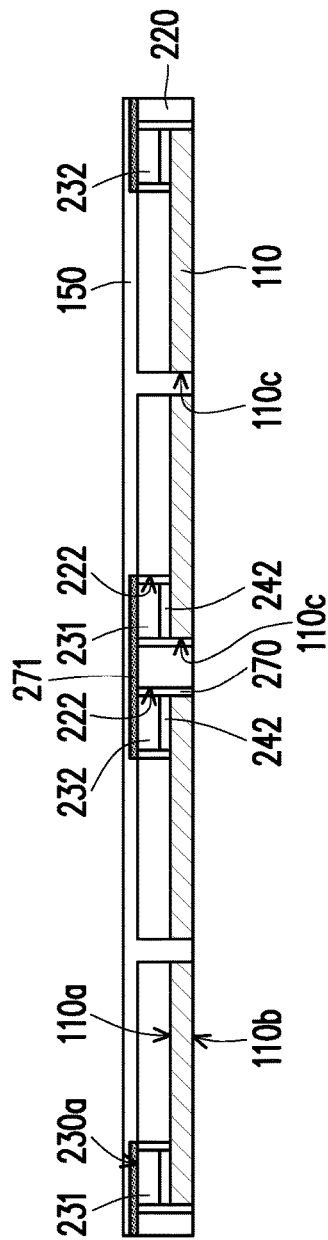

Next, referring to FIG. 2G, the temporary carrier 10 is removed to expose the second surface 110b of the circuit layer 110.

Figure 2H:
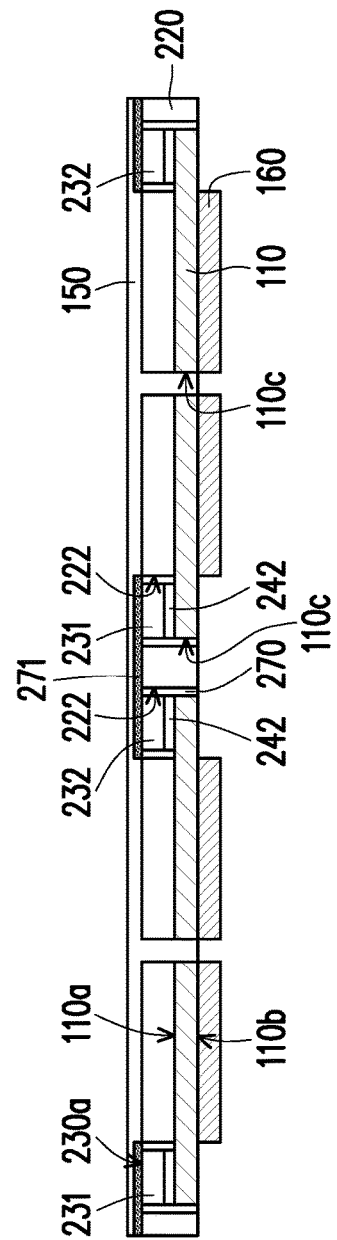

Next, referring to FIG. 2H, the plurality of connecting pads 160 are formed on the second surface 110b of the circuit layer 110. Each of the connecting pads 160 may be electrically connected to the corresponding light emitting diodes 231, 232 and 233 through the circuit layer 110.

Figure 2I:
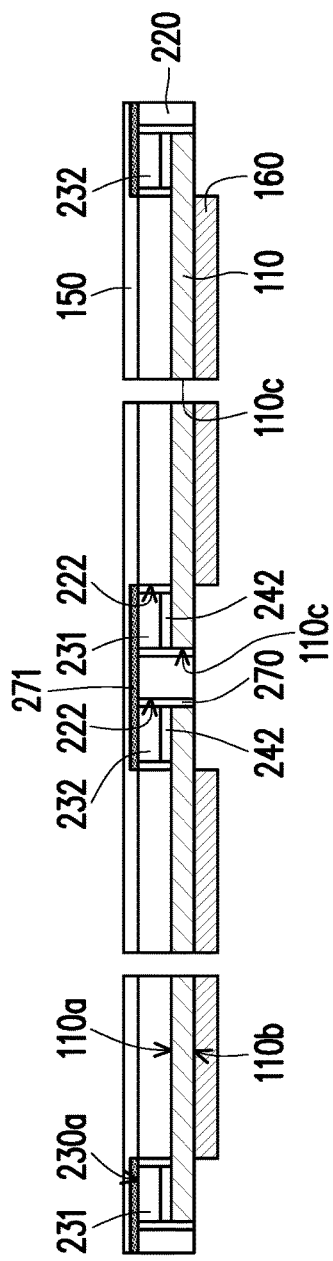
Figure 2J:
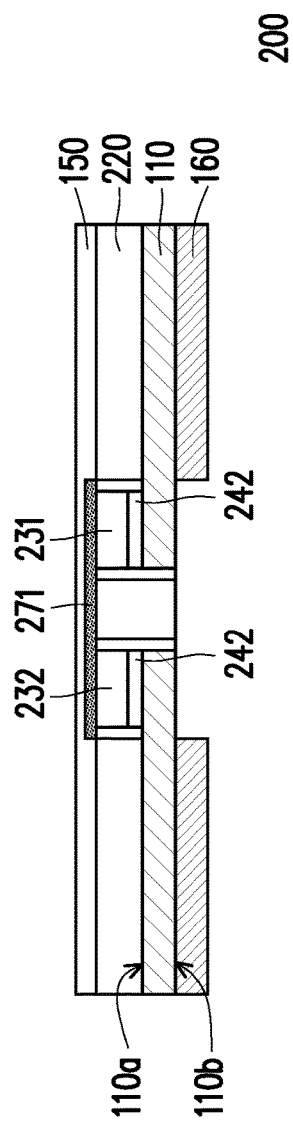
Figure 2K:
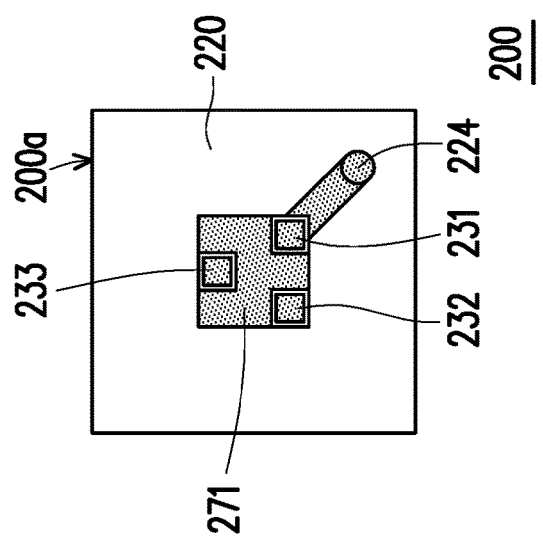
FIG. 2K is a top view illustrating the light emitting diode package according to the second embodiment of the disclosure.

Next, referring to FIGS. 2I and 2J, in FIG. 2I, the plurality of light emitting diode packages 200 as shown in FIG. 2J may be formed through the singulation process. Above all, after the singulation process is conducted, similar reference numerals are used to denote singulated elements. For example, the singulated circuit layer 110 is called the circuit layer 110, the singulated light emitting diodes 231, 232 and 233 are called the light emitting diodes 231, 232 and 233, the singulated dielectric layer 270 is called the dielectric layer 270, the singulated transparent electrode layer 271 is called the transparent electrode layer 271, the singulated encapsulation layer 150 is called the encapsulation layer 150, the singulated connecting pads 160 is called the connecting pads 160 and so on. Other singulated elements follow the same rule on the reference numeral, so a detailed description is omitted.

Referring to FIGS. 2J to 2K, after the above process, the production of the light emitting diode package 200 according to the exemplary embodiment of the disclosure may be roughly completed. Above all, to achieve concise illustration, FIG. 2K merely illustrates the light emitting diodes 231, 232 and 233, the light-shielding layer 220, the third aperture 224 of the light-shielding layer 220 and the transparent electrode layer 271. The transparent electrode layer 271 covers the light emitting diodes 231, 232 and 233 and the light-shielding layer 220, and filled in the third aperture 224 of the light-shielding layer 220.

The light emitting diode package 200 according to the exemplary embodiment of the disclosure is similar to the light emitting diode package 100 of FIGS. 1J to 1M except that the light emitting diodes 231, 232 and 233 may be vertical type light emitting diodes. The transparent electrode layer 271 covers the light-exiting top surface 230a of the light emitting diodes 231, 232 and 233, and is filled in the third aperture 224 of the light-shielding layer 220 to make the light emitting diodes 231, 232 and 233 electrically connected to the common bonding pad 164 through the transparent electrode layer 271.

Similar to the plurality of light emitting diodes 131, 132 and 133 in the light emitting diode package 100, the anodes of the plurality of light emitting diodes 231, 232 and 233 according to the exemplary embodiment of the disclosure may be electrically connected, but the disclosure is not limited thereto. In other feasible exemplary embodiments of the disclosure, the cathodes of the light emitting diodes 231, 232 and 233 are electrically connected, but the disclosure is not limited thereto.

In the exemplary embodiment of the disclosure, the first light emitting diode 231, the second light emitting diode 232 and the third light emitting diode 233 may emit light in different colors respectively, and may be arranged in the delta configuration. In this way, the shortest distance between each of the light emitting diodes 231, 232 and 233 and an edge 200a of the light emitting diode package 200 is not too large, so the display quality may be elevated.

FIGS. 3A to 3I are cross-sectional views illustrating a part of a method of manufacturing a light emitting diode package according to a third embodiment of the disclosure. FIG. 3J is a bottom view illustrating the light emitting diode package according to the third embodiment of the disclosure. In the exemplary embodiment of the disclosure, a method of manufacturing a light emitting diode package 300 is similar to the methods of manufacturing the light emitting diode packages 100 and 200, and similar elements are denoted by the same reference numerals, have similar functions and materials, or forming methods. A detailed description is omitted. Specifically, FIGS. 3A to 3I are cross-sectional views illustrating the method of manufacturing the light emitting diode package following the steps shown in FIG. 1B.

Referring to FIG. 3A, in the exemplary embodiment of the disclosure, after formation of the circuit layer 110, a device layer 380 is formed on the circuit layer 110 and electrically connected to the circuit layer 110. The device layer 380 may include a plurality of driving circuit devices configured by active devices and wirings. The active device may be, for example, a transistor, and the wirings may be, for example, scan lines and data lines that are electrically separated from each other, but the disclosure is not limited thereto. In addition, based on demand for the circuit layout, the device layer 380 may also include capacitor, resistor or other passive devices to adjust voltage, electric current or delay of electric signals. The wirings, the active device, the passive devices or other electronic devices in the device layer 380 may be formed through a semiconductor process, and a detailed description is omitted.

Next, referring to FIG. 3B, after formation of the device layer 380, a light-shielding layer 320 is formed on the circuit layer 110 to cover the device layer 380 that is disposed on the circuit layer 110 and a part of the circuit layer 110. The light-shielding layer 320 includes a plurality of first apertures 321 and second apertures 322. The first aperture 321 and the second aperture 322 penetrate the circuit layer 110 to expose at least the temporary carrier 10. Moreover, the second aperture 322 further exposes the part of first surface 110a and the sidewalls 110c of the circuit layer 110. In the exemplary embodiment of the disclosure, the first aperture 321 may be, for example, a trench, and the trench-shaped first aperture 321 may surround the plurality of second apertures 322, and in the following processes, the trench-shaped first aperture 321 may basically define a size of the light emitting diode package 300.

In the exemplary embodiment of the disclosure, the first aperture 321 exposes the sidewalls 110c of a circuit layer 310, but the disclosure is not limited thereto. In other exemplary embodiments of the disclosure, the light-shielding layer 320 may also cover the sidewalls 110c of the circuit layer 110 exposed by the first aperture 321.

In the exemplary embodiment of the disclosure, a material or a forming method of the light-shielding layer 320 may be similar to the material or the forming method of the light-shielding layer 120 according to the exemplary embodiment of the disclosure described above, but the disclosure is not limited thereto.

Next, referring to FIG. 3C, the plurality of first light emitting didoes 131 are disposed on the circuit layer 110, and the light emitting diode 131 is disposed in the corresponding second aperture 322. In the exemplary embodiment of the disclosure, the installation of the first light emitting diode 131 may be similar to the installation of the first light emitting diode 131 according to the exemplary embodiment of the disclosure described above, so a detailed description is omitted.

Next, referring to FIG. 3D, the plurality of second light emitting diodes 132 and third light emitting diodes 133 (shown in FIG. 1K) may be disposed sequentially on the circuit layer 110 in a similar way to the way that the first light emitting diode 131 is disposed. The first light emitting diode 131, the second light emitting diode 132 and the third light emitting diode 133 are disposed in the different second apertures 322 respectively.

In the exemplary embodiment of the disclosure, the light emitting diodes 131, 132 and 133 may be horizontal type light emitting diodes and may be electrically connected to the corresponding the circuit layer 110 through the connecting terminal 141, wherein the connecting terminal 141 are used in the flip chip bonding to be electrically connected to the device layer 380.

Figure 3E:
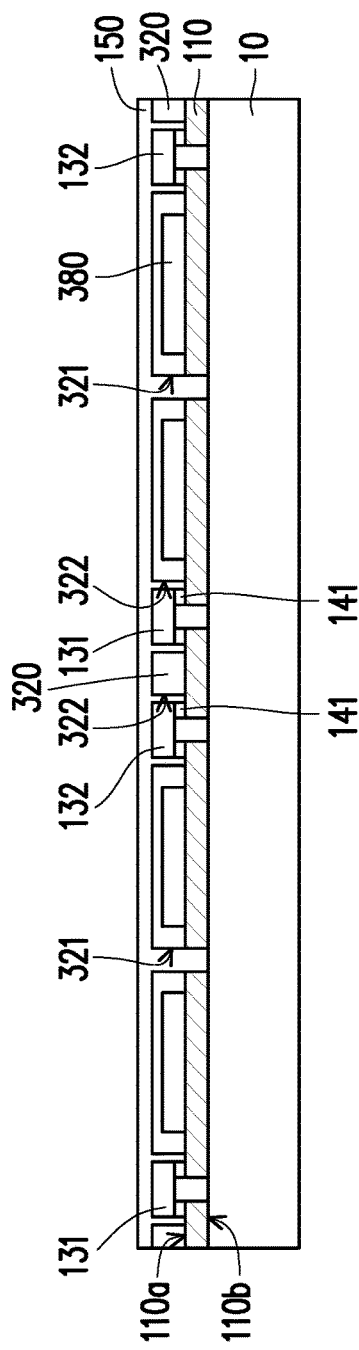

Next, referring to FIGS. 3D and 3E, after the light emitting diodes 131, 132 and 133 are disposed on the circuit layer 110 and electrically connected to the circuit layer 110, the encapsulation layer 150 having an insulating property is formed on the temporary carrier 10 and filled in the first aperture 321 and the second aperture 322 to cover the light-shielding layer 320 and the light emitting diodes 131, 132 and 133.

Figure 3F:
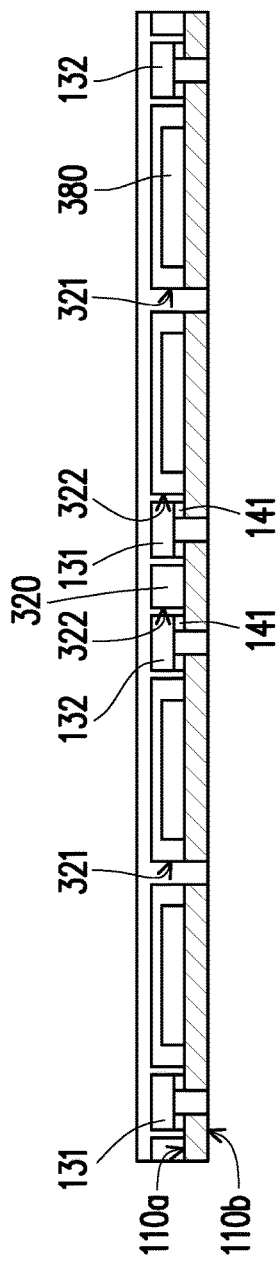

Next, referring to FIGS. 3E and 3F, after formation of the encapsulation layer 150, the temporary carrier 10 is removed to expose the second surface 110b of the circuit layer 110.

Figure 3G:
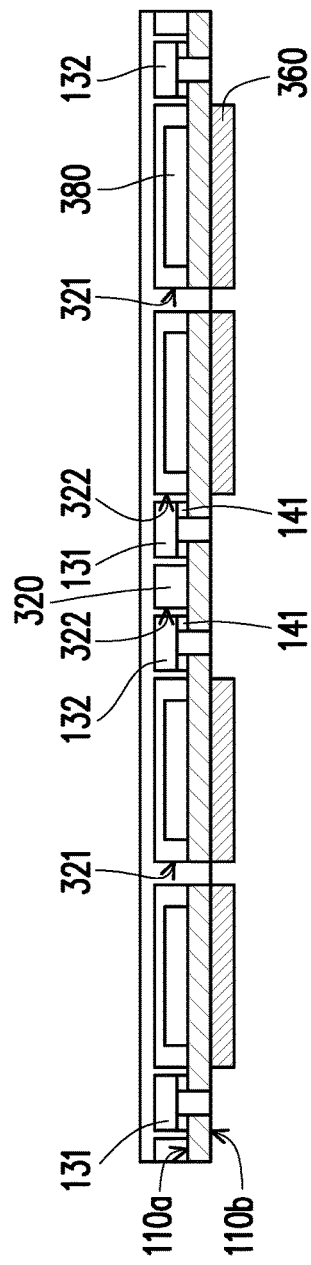

Next, referring to FIG. 3G, the plurality of connecting pads 360 are formed on the second surface 110b of the circuit layer 110, and each of the connecting pads 360 may be electrically connected to the corresponding light emitting diodes 131, 132 and 133 and the device layer 380 through the circuit layer 110. A material or a forming method of the connecting pad 360 may be similar to the material or the forming method of the connecting pads 160 according to the exemplary embodiment of the disclosure described above (like the steps shown in FIG. 1H), so a detailed description is omitted.

Figure 3H:
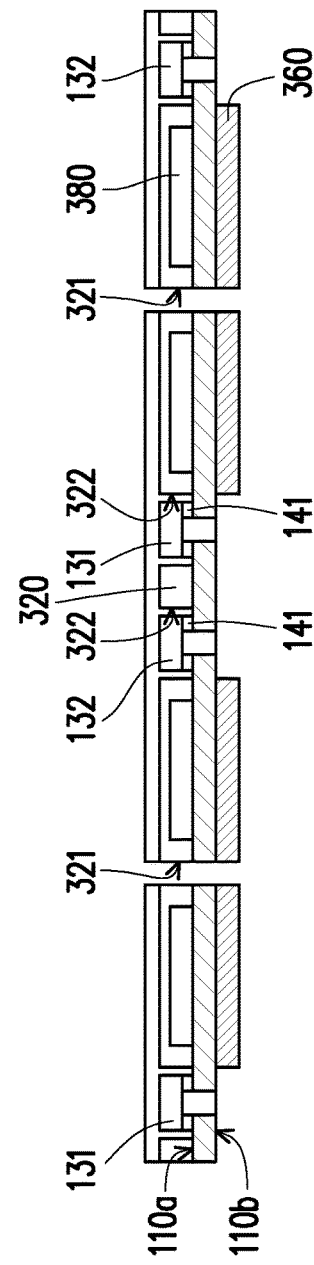

Next, referring to FIGS. 3H and 3I, in FIG. 3H, the plurality of light emitting diode packages 300 as shown in FIG. 3I may be formed through the singulation process. Above all, after the singulation process is conducted, similar reference numerals are used to denote singulated elements. For example, the singulated circuit layer 110 is called the circuit layer 110, the singulated device layer 380 is called the device layer 380, the singulated light-shielding layer 320 is called the light-shielding layer 320, the singulated light emitting diodes 131, 132 and 133 are called light emitting diodes 131, 132 and 133, the singulated encapsulation layer 150 is called the encapsulation layer 150, and the singulated connecting pad 360 is called the connecting pad 360 and so on. Other singulated elements follow the same rule on the reference numeral, so a detailed description is omitted.

Referring to FIG. 3I, after the above process is conducted, the production of the light emitting diode package 300 according to the exemplary embodiment of the disclosure is roughly completed. Above all, for concise illustration, FIG. 3J merely shows the position relation between the plurality of connecting pads 360, but the position relation between the plurality of connecting pads 360 may be adjusted based on demand for the circuit layout. The disclosure is not limited thereto.

The light emitting diode package 300 according to the exemplary embodiment of the disclosure is similar to the light emitting diode package 100 of FIGS. 1J to 1M except that the light emitting diode package 300 further includes the device layer 380 and that a difference between the number of the connecting pad 360 and the number of the light emitting diodes 131, 132 and 133 is 3.

In the exemplary embodiment of the disclosure, the device layer 380 includes the plurality of active devices (not shown), a scan line (not shown), a plurality of data lines (not shown), a power line (not shown) and a ground line (not shown), and the plurality of connecting pads 360 include a plurality of data connecting pads 365, scan connecting pads 366, power connecting pads 367 and common bonding pads 364. The skilled person in the art may complete the arrangement of the circuit, so a detailed description is omitted. The number of the data connecting pads 365 is the same as the number of the light emitting diodes 131, 132 and 133.

FIGS. 4A to 4I are cross-sectional views illustrating a part of a method of manufacturing a light emitting diode package according to a fourth embodiment of the disclosure. In the exemplary embodiment of the disclosure, a method of manufacturing a light emitting diode package 400 is similar to the method of manufacturing the light emitting diode package 100, and similar elements of the light emitting diode package 400 are denoted by the same reference numerals, have similar functions, materials, or forming methods. A detailed description is omitted. Specifically, FIGS. 4A to 4I are cross-sectional views illustrating the method of manufacturing the light emitting diode package following the steps shown in FIG. 1B.

Figure 4A:
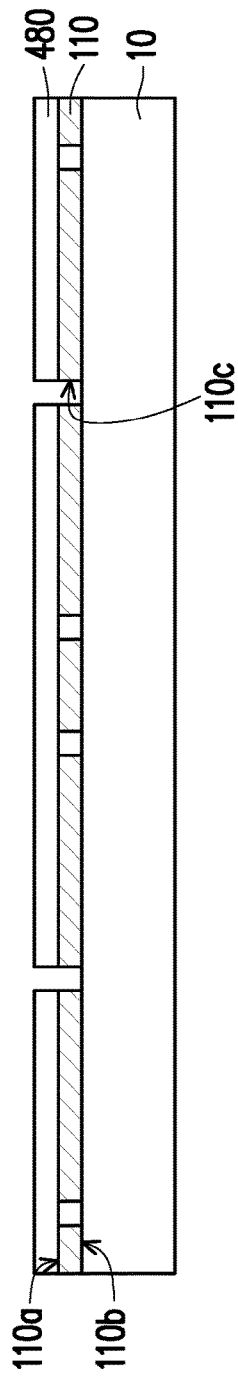

Further to FIG. 1B, referring to FIG. 4A, in the exemplary embodiment of the disclosure, after formation of the circuit layer 110, a device layer 480 is formed on the circuit layer 110 and electrically connected to the circuit layer 110. In the exemplary embodiment of the disclosure, the installation of the device layer 480 is similar to the installation of the device layer 380 according to the exemplary embodiment of the disclosure described above except that the device layer 480 completely covers the first surface 110a of the circuit layer 110 and may expose a part of temporary carrier 10 that is not covered by the circuit layer 110.

Figure 4B:
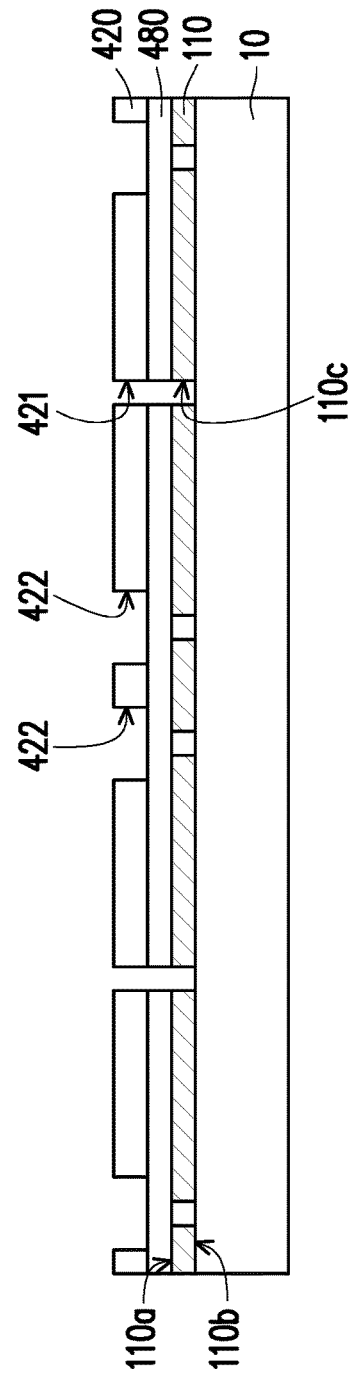

Next, referring to FIG. 4B, after formation of the device layer 480, a light-shielding layer 420 is formed on the device layer 480. The light-shielding layer 420 includes a plurality of first apertures 421 and second apertures 422. The first aperture 421 exposes the part of the temporary carrier 10 that is not covered by the device layer 480 and the circuit layer 110, and the second aperture 422 exposes a part of device layer 480. In the exemplary embodiment of the disclosure, the first aperture 421 may be, for example, a trench, and the trench-shaped first aperture 421 may surround the plurality of second apertures 422, and in the following processes, the trench-shaped first aperture 421 may basically define a size of the light emitting diode package 400.

In the exemplary embodiment of the disclosure, the first aperture 421 exposes the sidewalls 110c of the circuit layer 110, but the disclosure is not limited thereto. In other exemplary embodiments of the disclosure, the light-shielding layer 420 may also cover the sidewalls 110c of the circuit layer 110 exposed by the first aperture 421.

In the exemplary embodiment of the disclosure, a material or a forming method of the light-shielding layer 420 may be similar to the material or the forming method of the light-shielding layer 120 according to the exemplary embodiment of the disclosure described above, but the disclosure is not limited thereto.

Next, referring to FIG. 4C, the plurality of first light emitting diodes 131 are disposed on the device layer 480, and the first light emitting diode 131 is disposed in the corresponding second aperture 422.

Next, referring to FIG. 4D, the plurality of second light emitting diodes 132 and third light emitting diodes 133 (shown in FIG. 1K) may be disposed sequentially on the device layer 480 in a similar way to the way that the first light emitting diode 131 is disposed. The first light emitting diode 131, the second light emitting diode 132 and the third light emitting diode 133 are disposed in the different second apertures 422 respectively.

In the exemplary embodiment of the disclosure, the first light emitting diode 131, the second light emitting diode 132 and the third light emitting diode 133 may be horizontal type light emitting diodes and may be electrically connected to the corresponding device layer 480 through the connecting terminal 141, wherein the connecting terminal 141 are used in the flip chip bonding to be electrically connected to the circuit layer 110.

Next, referring to FIGS. 4D and 4E, after the first light emitting diode 131, the second light emitting diode 132 and the third light emitting diode 133 are disposed on the circuit layer 110 and electrically connected to the circuit layer 110, the encapsulation layer 150 having an insulating property is forming on the temporary carrier 10 and filled in the first aperture 421 and the second aperture 422 to cover the light-shielding layer 420 and the light emitting diodes 131, 132 and 133.

Next, referring to FIGS. 4E and 4F, after formation of the encapsulation layer 150, the temporary carrier 10 is removed to expose the second surface 110b of the circuit layer 110.

Next, referring to FIG. 4G, the plurality of connecting pads 360 are formed on the second surface 110b of the circuit layer 110. Each of the connecting pads 360 are electrically connected to the corresponding light emitting diodes 131, 132 and 133 and the device layer 480 through the circuit layer 110.

Figure 4I:
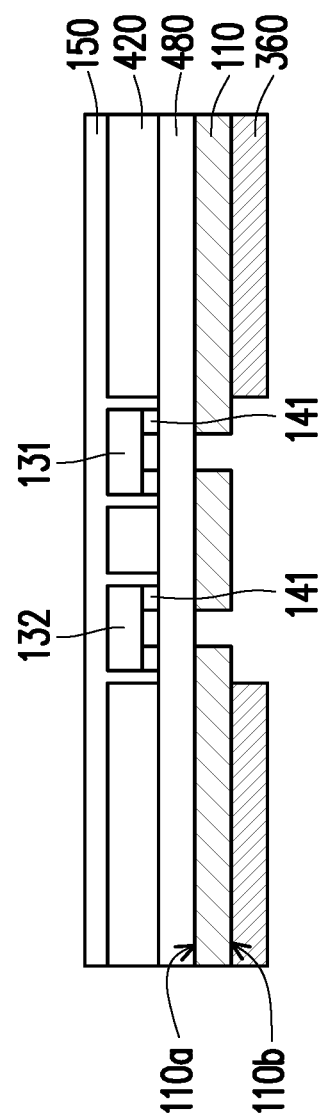

Next, referring to FIGS. 4H and 4I, in FIG. 4H, the plurality of light emitting diode packages 400 as shown in FIG. 4I may be formed through the singulation process. Above all, after the singulation process is conducted, similar reference numerals are used to denote singulated elements. For example, the singulated circuit layer 110 is called the circuit layer 110, the singulated device layer 480 is called the device layer 480, the singulated light-shielding layer 420 is called the light-shielding layer 420, the singulated light emitting diodes 131, 132 and 133 are called the light emitting diodes 131, 132 and 133, the singulated encapsulation layer 150 is called the encapsulation layer 150, the singulated connecting pad 360 is called the connecting pad 360 and so on. Other singulated elements follow the same rule on the reference numeral, so a detailed description is omitted.

Referring to FIGS. 3I and 3J, after the above process is conducted, the production of the light emitting diode package 400 according to the exemplary embodiment of the disclosure is roughly completed. The light emitting diode package 400 according to the exemplary embodiment of the disclosure is similar to the light emitting diode package 300 of FIGS. 3I and 3J except that the device layer 480 is disposed between the light emitting diodes 131, 132 and 133 and the circuit layer 110 and that the light emitting diodes 131, 132 and 133 are electrically connected to the circuit layer 110 through the device layer 480.

FIGS. 5A to 5H are cross-sectional views illustrating a part of a method of manufacturing a light emitting diode package according to a fifth exemplary embodiment of the disclosure. In the exemplary embodiment of the disclosure, a method of manufacturing a light emitting diode package 500 is similar to the method of manufacturing the light emitting diode package 100, and similar elements of the light emitting diode package 500 are denoted by the same reference numerals and have similar functions, materials or forming methods. A detailed description is omitted. Specifically, FIGS. 5A to 5H are cross-sectional views illustrating the method of manufacturing the light emitting diode package following the steps shown in FIG. 1C.

Figure 5A:
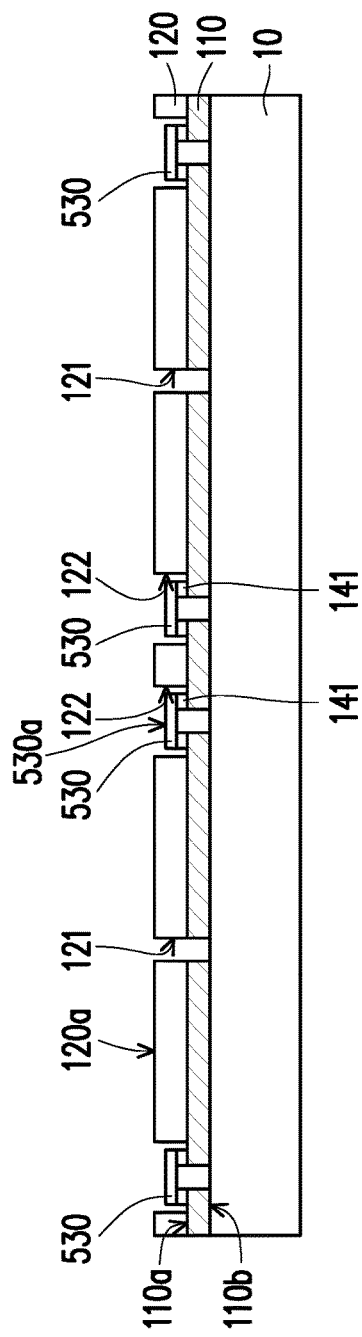

Further to FIG. 1C, referring to FIG. 5A, in the exemplary embodiment of the disclosure, after formation of the light-shielding layer 120, a plurality of light emitting diodes 530 are disposed on the circuit layer 110 and disposed in the corresponding second apertures 122 respectively. In the exemplary embodiment of the disclosure, the installation of the light emitting diode 530 may be similar to the installation of the light emitting diodes 131, 132 and 133 according to the exemplary embodiment of the disclosure described above except that the light emitting diodes 530 may emit light in the same color respectively and that a light-exiting top surface 530a of the light emitting diode 530 is lower than the light blocking top surface 120a of the light-shielding layer 120. In other words, a distance between the light-exiting top surface 530a and the first surface 110a is smaller than a distance between the light blocking top surface 120a and the first surface 110a.

In the exemplary embodiment of the disclosure, the light emitting diode 530 may be a horizontal type light emitting diode and may be electrically connected to the corresponding circuit layer 110 through the connecting terminal 141, wherein the connecting terminal 141 is, for example, a solder ball, used in the flip chip bonding, but the disclosure is not limited thereto.

Figure 5B:
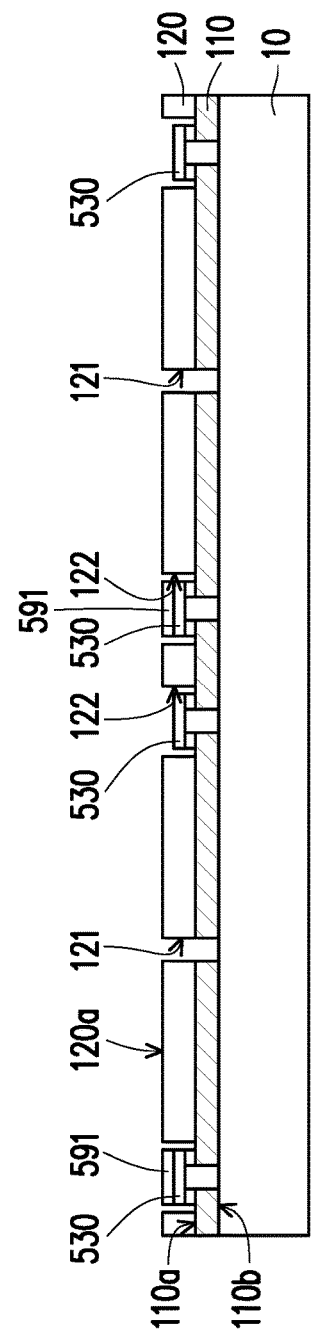

Next, referring to FIG. 5B, a first light conversion layer 591 is formed on parts of the light emitting diodes 530.

Next, referring to FIG. 5C, a second light conversion layer 592 is formed on other light emitting diodes 530.

In the exemplary embodiment of the disclosure, the first light conversion layer 591 and/or the second light conversion layer 592 may be quantum dot or fluorescent materials, but the disclosure is not limited thereto. As long as the light emitting diode 530 has single light-emitting color, whichever combination of the light emitting diode 530 and the light conversion layer that can display three different colors by converting the single light-emitting color through the first light conversion layer 591 and/or the second light conversion layer 592 is desirable. For example, In the exemplary embodiment of the disclosure, the light emitting diode 530 may emit blue light, and the first light conversion layer 591 disposed on parts of the light emitting diodes 530 may absorb blue light and emit red light, while the second light conversion layer 592 disposed on parts of the light emitting diodes 530 may absorb blue light and emit green light.

In other exemplary embodiments of the disclosure, a third light conversion layer (not shown) may also be provided and disposed on parts of the light emitting diodes 530. For example, the light emitting diode 530 may emit near ultraviolet light (near UV), the first light conversion layer 591 disposed on parts of the light emitting diodes 530 may absorb near ultraviolet light and emit red light, the second light conversion layer 592 disposed on parts of light emitting diodes 530 may absorb near ultraviolet light and emit green light, and the third light conversion layer disposed on the other light emitting diodes 530 may absorb near ultraviolet light and emit blue light.

In the exemplary embodiment of the disclosure, a light conversion layer top surface 590a of the light conversion layers 591 and 592 may be aligned with the light blocking top surface 120a of the light-shielding layer 120, but the disclosure is not limited thereto. In other exemplary embodiments of the disclosure, the light conversion layer top surface 590a of the light conversion layers 591 and 592 may be lower than the light blocking top surface 120a of the light-shielding layer 120. In other words, a distance between the conversion layer top surface and the first surface 110a may be smaller than a distance between the light blocking top surface 120a and the first surface 110a.

Next, referring to FIG. 5D, the encapsulation layer 150 having an insulating property is formed on the temporary carrier 10 and filled in the first aperture 121 and the second aperture 122 to cover the light conversion layers 591 and 592, the light-shielding layer 120 and the light emitting diode 530.

Next, referring to FIG. 5E, the temporary carrier 10 is removed to expose the second surface 110b of the circuit layer 110.

Next, referring to FIG. 5F, the plurality of connecting pads 160 are formed on the second surface 110b of the circuit layer 110, and each of the connecting pads 160 may be electrically connected to the corresponding light emitting diode 530 through the circuit layer 110.

Figure 5G:
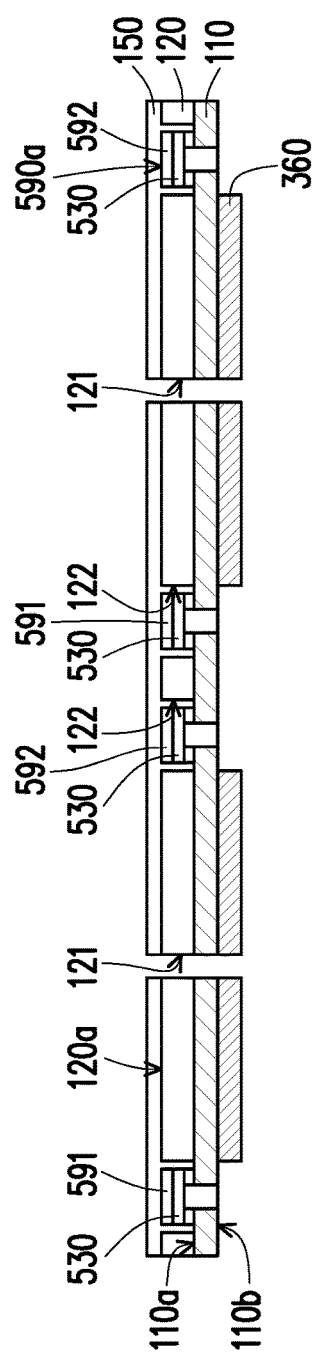
Figure 5H:
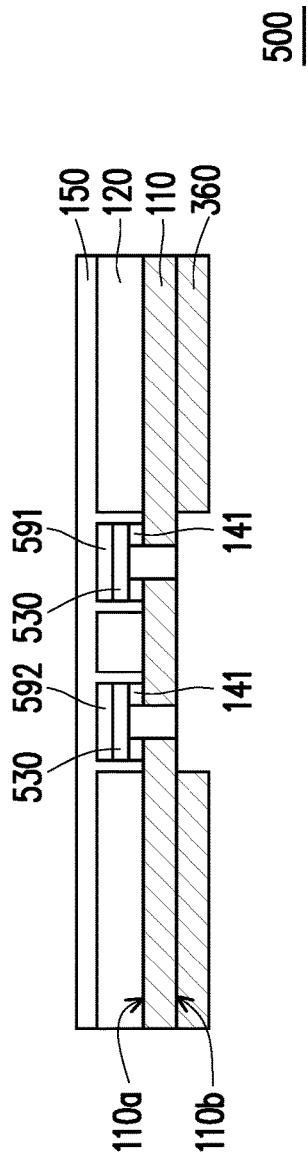

Next, referring to FIGS. 5G and 5H, in FIG. 5G, the plurality of light emitting diode packages 500 as shown in FIG. 5G may be formed through the singulation process. Above all, after the singulation process is conducted, similar reference numerals are used to denote singulated elements. For example, the singulated circuit layer 110 is called the circuit layer 110, the singulated light emitting diode 530 is called the light emitting diode 530, the singulated light conversion layers 591 and 592 are called the light conversion layers 591 and 592, the singulated encapsulation layer 150 is called the encapsulation layer 150, the singulated connecting pads 160 are called the connecting pads 160 and so on. Other singulated elements follow the same rule on the reference numeral, so a detailed description is omitted.

Referring to FIG. 5H, after the above process is conducted, the production of the light emitting diode package 500 according to the exemplary embodiment of the disclosure is roughly completed. The light emitting diode package 500 according to the exemplary embodiment of the disclosure is similar to the light emitting diode package 100 of FIGS. 1J to 1M except that the light emitting diode 530 may have the light conversion layers 591 and 592 disposed thereon.

In view of the foregoing, the light emitting diode package and the manufacture method thereof according to the exemplary embodiments of the disclosure may shrink the size of the light emitting diode package slightly. Moreover, compared with other display devices with a display screen of the same size, a display device to which the light emitting diode package according to the exemplary embodiments of the disclosure is applied may have increased resolution. In addition, a substrate may be omitted from the light emitting diode package according to the exemplary embodiments of the disclosure, and thus manufacturing costs are lowered down. In this way, the light emitting diode package and the manufacture method thereof according to the exemplary embodiments of the disclosure may produce more desirable display quality and lower costs.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A light emitting diode package, comprising:
   a circuit layer, having a thickness of less than 100 micrometers;
   a light-shielding layer, disposed on the circuit layer and having a plurality of apertures;
   a plurality of light emitting diodes, disposed on the circuit layer and in the plurality of apertures of the light-shielding layer and electrically connected to the circuit layer; and
   an encapsulation layer, covering the light-shielding layer, wherein a refractive index of the encapsulation layer is 1.4 to 1.7, a Young's modulus of the encapsulation layer is greater than or equal to 1 GPa, and a thickness of the encapsulation layer is greater than thicknesses of the plurality of light emitting diodes.

2. The light emitting diode package according to claim 1, further comprising:
   a plurality of connecting pads, wherein the plurality of connecting pads and the plurality of light emitting diodes are disposed on different sides of the circuit layer, a number of the plurality of connecting pads is greater than a number of the plurality of light emitting diodes, and a difference between the number of plurality of connecting pads and the number of the plurality of light emitting diodes is 1.

3. The light emitting diode package according to claim 1, further comprising:
   a plurality of light conversion layers, disposed corresponding to parts of the plurality of light emitting diodes.

4. The light emitting diode package according to claim 1, further comprising:
   a device layer, disposed on the circuit layer and comprising a plurality of active devices electrically connected to the plurality of corresponding light emitting diodes.

5. The light emitting diode package according to claim 4, wherein the light-shielding layer covers the device layer.

6. The light emitting diode package according to claim 4, wherein the plurality of apertures of the light-shielding layer expose a part of the device layer.

7. The light emitting diode package according to claim 4, further comprising:
   a plurality of connecting pads, wherein the plurality of connecting pads and the plurality of light emitting diodes are disposed on different sides of the circuit layer, a number of the plurality of connecting pads is greater than a number of the plurality of light emitting diodes, and a difference between the number of the plurality of connecting pads and the number of the plurality of light emitting diodes is 3.

8. The light emitting diode package according to claim 1, wherein the encapsulation layer is further filled in the plurality of apertures.

9. The light emitting diode package according to claim 1, wherein the light-shielding layer comprises a through-hole, and the light emitting diode package further comprises:
   a dielectric layer, filled in the plurality of apertures to cover the circuit layer exposed by the plurality of apertures;
   a plurality of connecting pads, wherein the plurality of connecting pads and the plurality of light emitting diodes are disposed on different sides of the circuit layer; and
   a transparent electrode layer, disposed on the light-shielding layer, the plurality of light emitting diodes and the dielectric layer and filled in the through-hole, wherein one of the plurality of connecting pads is electrically connected to the plurality of light emitting diodes through the transparent electrode layer.

10. The light emitting diode package according to claim 1 wherein the package is a substrateless package.

* * * * *